(12) United States Patent
Kimura

(10) Patent No.: US 9,154,753 B2
(45) Date of Patent: Oct. 6, 2015

(54) CONTROL APPARATUS, CONTROL METHOD, DRIVING APPARATUS, AND ELECTRONIC APPARATUS

(71) Applicant: Sony Corporation, Tokyo (JP)

(72) Inventor: Motoi Kimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 176 days.

(21) Appl. No.: 14/054,869

(22) Filed: Oct. 16, 2013

(65) Prior Publication Data

US 2014/0126590 A1    May 8, 2014

(30) Foreign Application Priority Data

Nov. 8, 2012   (JP) .................................. 2012-246641

(51) Int. Cl.
*H04N 9/31*   (2006.01)
*H01S 5/00*   (2006.01)
*H01S 5/042*  (2006.01)

(52) U.S. Cl.
CPC ........... *H04N 9/3135* (2013.01); *H04N 9/3182* (2013.01); *H04N 9/3194* (2013.01); *H01S 5/0071* (2013.01); *H01S 5/0428* (2013.01)

(58) Field of Classification Search
CPC ........ H01S 5/06; H01S 5/0071; H01S 5/0428
See application file for complete search history.

(56) References Cited

U.S. PATENT DOCUMENTS

2006/0245462 A1\* 11/2006 Takeda ............................ 372/93
2014/0104501 A1\* 4/2014 Jackson ........................ 348/744

FOREIGN PATENT DOCUMENTS

JP         2003-021800        1/2003

\* cited by examiner

*Primary Examiner* — Jessica Stultz
*Assistant Examiner* — Michael Carter
(74) *Attorney, Agent, or Firm* — Michael Best & Friedrich LLP

(57) ABSTRACT

A generation unit generates adjustment information to adjust a first clock indicating a timing of illumination of a laser beam to scan on a screen, based on a scanning position to be scanned by the laser beam. On the basis of the adjustment information, adjustment unit adjusts the first clock to a second clock different from the first clock. Then, in synchronization with the second clock, the laser beam is allowed to illuminate as a pixel. This may be applicable to a projection apparatus for projecting an image on the screen, for example.

19 Claims, 19 Drawing Sheets

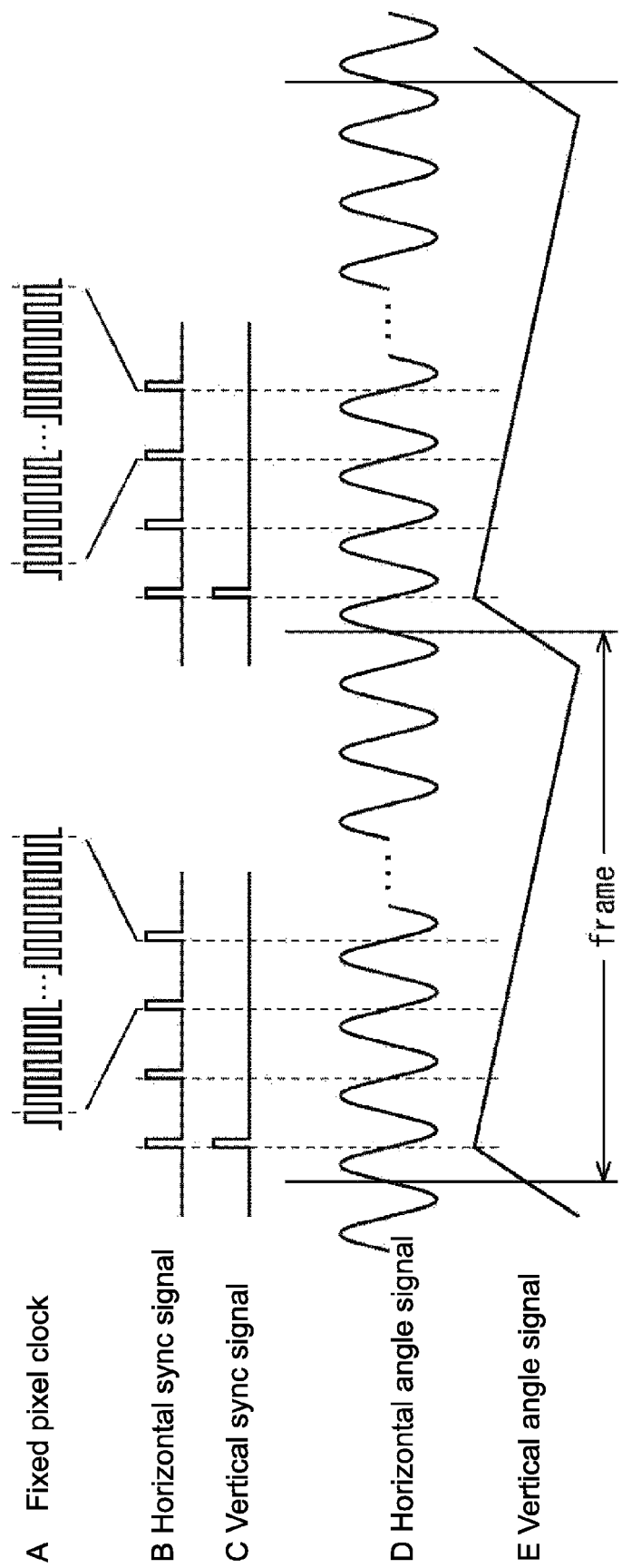

| Count | Fixed pixel clock | Output selection information | Variable pixel clock |
|---|---|---|---|
| 1 | $t_0$ | OUT0 | 0 |
| 2 | $t_1$ | OUT0 | 1 |
| 3 | $t_2$ | OUT2 | 2 |
| 4 | $t_3$ | OUT4 | 3 |
| 5 | $t_4$ | — | |
| 6 | $t_5$ | OUT0 | 4 |
| 7 | $t_6$ | OUT6 | 5 |
| 8 | $t_7$ | — | |
| 9 | $t_8$ | OUT4 | 6 |
| 10 | $t_9$ | — | |
| 11 | $t_{10}$ | OUT4 | 7 |
| 12 | $t_{11}$ | — | |
| 13 | $t_{12}$ | OUT6 | 8 |
| 14 | $t_{13}$ | — | |

FIG.12

CONTROL APPARATUS, CONTROL METHOD, DRIVING APPARATUS, AND ELECTRONIC APPARATUS

CROSS REFERENCE TO RELATED APPLICATIONS

This application claims the benefit of Japanese Priority Patent Application JP 2012-246641 filed Nov. 8, 2012, the entire contents of which are incorporated herein by reference.

BACKGROUND

The present disclosure relates to a control apparatus, a control method, a driving apparatus and an electronic apparatus. More particularly, the present disclosure relates to a control apparatus, a control method, a driving apparatus and an electronic apparatus, which are able to prevent luminance non-uniformity of an image to be projected on a screen, for example.

SUMMARY

From the past, for example, there is a projection apparatus which performs scanning, sinusoidally reciprocating laser beams, at a screen as the target (see, for example, Japanese Patent Application Laid-open No. 2003-21800).

In this projection apparatus, a driving mirror which reflects a laser beam is driven, and each position on the screen is illuminated by the laser beam reflected from the driving mirror.

Thus, to each position on the screen, by illumination with the laser beam, a spot beam which is light having a spot shape is projected. That is, on the screen, an image with a plurality of spot beams serving as respective pixels is projected.

Incidentally, as the laser beams are made to scan at a scanning speed corresponding to the resonance frequency of the driving mirror, the scanning speed becomes the fastest in the center of the screen and becomes slower toward the edge of the screen. In addition, the projection apparatus in the past illuminates the screen with a laser beam in synchronization with the timing coming at predetermined intervals.

Thus, as the position becomes nearer to the edge of the screen, the spot beams as the pixels become closer to each other, and there has been luminance non-uniformity in the image projected on the screen.

As described above, the projection apparatus in the past may cause luminance non-uniformity in the image projected on the screen, which may be uncomfortable to viewers viewing the image on the screen.

In view of the above-mentioned circumstances, it is desirable to prevent luminance non-uniformity of an image to be projected on a screen.

A control apparatus according to an embodiment of the present disclosure includes a generation unit, an adjustment unit and a laser control unit. The generation unit is configured to generate adjustment information to adjust a first clock indicating a timing of illumination of a laser beam to scan on a screen, based on a scanning position to be scanned by the laser beam. The adjustment unit is configured to adjust the first clock to a second clock different from the first clock, based on the adjustment information. The laser control unit is configured to allow illumination of the laser beam as a pixel, in synchronization with the second clock.

The laser control unit may be configured to allow the illumination of the laser beam, in synchronization with the second clock, such that a total of optical power of the laser beam is substantially the same for each pixel projected on the screen.

The laser control unit may be configured to allow the illumination of the laser beam at a fixed optical power for a fixed illumination time irrespective of the scanning position, in synchronization with the second clock, such that a total of optical power of the laser beam is substantially the same for each pixel projected on the screen.

The laser control unit may be configured to allow the illumination of the laser beam at a different optical power and for a different illumination time for each scanning position, in synchronization with the second clock, such that a total of optical power of the laser beam is substantially the same for each pixel projected on the screen.

A ratio of the illumination time, to a pixel period from the time that a rising edge occurs until the next rising edge occurs, may be substantially the same irrespective of the scanning position.

The laser control unit may be configured to allow illumination of the laser beam as pixels, to be illuminated on the screen at even intervals, in synchronization with the second clock.

The generation unit may be configured to generate the adjustment information, based on the scanning position, for delaying the first clock by a delay time that depends on the scanning position; and the adjustment unit may be configured to adjust the first clock to the second clock that is delayed from the first clock by the delay time, based on the adjustment information.

The adjustment unit may have a timing delay unit and a selection unit. The timing delay unit is configured to delay the first clock by a plurality of different delay times to obtain a plurality of delayed first clocks. The selection unit is configured to select one among the plurality of delayed first clocks delayed by the respective different delay times, as the second clock, based on the adjustment information.

The generation unit may have a position calculation unit and an information acquisition unit. The position calculation unit is configured to calculate the scanning position, based on the first clock. The information acquisition unit is configured to retrieve, from a plurality of different pieces of adjustment information held in advance, the adjustment information for delaying by the delay time that depends on the calculated scanning position.

The laser control unit may be configured to allow illumination of red, green, and blue laser beams in a form of a single laser beam, in synchronization with the second clock.

A control method according to an embodiment of the present disclosure is a method of controlling a control apparatus to control laser illumination. The method, by the control apparatus, includes generating adjustment information to adjust a first clock indicating a timing of illumination of a laser beam to scan on a screen, based on a scanning position to be scanned by the laser beam; adjusting the first clock to a second clock different from the first clock, based on the adjustment information; and controlling laser so as to allow illumination of the laser beam as a pixel in synchronization with the second clock.

According to these embodiments of the present disclosure, adjustment information, for adjusting a first clock indicating a timing of illumination of a laser beam to scan on a screen, is generated on the basis of a scanning position to be scanned by the laser beam. On the basis of the adjustment information, the first clock is adjusted to a second clock which is different from the first clock. The laser beam is allowed to illuminate as a pixel, in synchronization with the second clock.

A driving apparatus according to another embodiment of the present disclosure includes a generation unit, an adjustment unit and a laser drive unit. The generation unit is configured to generate adjustment information to adjust a first clock indicating a timing of illumination of a laser beam to scan on a screen, based on a scanning position to be scanned by the laser beam. The adjustment unit is configured to adjust the first clock to a second clock different from the first clock, based on the adjustment information. The laser drive unit is configured to drive a light source unit to illuminate with the laser beam, in synchronization with the second clock.

The laser drive unit may be configured to drive the light source unit to illuminate with the laser beam, in synchronization with the second clock, such that a total of optical power of the laser beam is substantially the same for each pixel projected on the screen.

The laser drive unit may be configured to drive the light source unit to illuminate with the laser beam at a fixed optical power for a fixed illumination time irrespective of the scanning position, in synchronization with the second clock, such that a total of optical power of the laser beam is substantially the same for each pixel projected on the screen.

The laser drive unit may be configured to drive the light source unit to illuminate with the laser beam at a different optical power and for a different illumination time for each scanning position, in synchronization with the second clock, such that a total of optical power of the laser beam is substantially the same for each pixel projected on the screen.

A ratio of the illumination time, to a pixel period from the time that a rising edge occurs until the next rising edge occurs, may be substantially the same irrespective of the scanning position.

The laser drive unit may be configured to drive the light source unit to illuminate with the laser beam as pixels, on the screen at even intervals, in synchronization with the second clock.

The light source may have at least a first laser light source configured to illuminate with a red laser beam, a second laser light source configured to illuminate with a green laser beam and a third laser light source configured to illuminate with a blue laser beam. The laser drive unit may have at least a first generating-and-driving unit, a second generating-and-driving unit and a third generating-and-driving unit. The first generating-and-driving unit is configured to generate a first laser drive current for allowing the illumination of the red laser beam, in synchronization with the second clock, and to drive the first laser light source on the basis of the generated first laser drive current. The second generating-and-driving unit is configured to generate a second laser drive current for allowing the illumination of the green laser beam, in synchronization with the second clock, and to drive the second laser light source on the basis of the generated second laser drive current. The third generating-and-driving unit is configured to generate a third laser drive current for allowing the illumination of the blue laser beam, in synchronization with the second clock, and to drive the third laser light source on the basis of the generated third laser drive current.

According to this embodiment of the present disclosure, adjustment information, for adjusting a first clock indicating a timing of illumination of a laser beam to scan on a screen, is generated on the basis of a scanning position to be scanned by the laser beam. On the basis of the adjustment information, the first clock is adjusted to a second clock which is different from the first clock. A light source unit to illuminate with the laser beam is driven in synchronization with the second clock.

An electronic apparatus according to still another embodiment of the present disclosure includes a light source unit, a laser drive unit, a generation unit, an adjustment unit and a laser control unit. The light source unit is configured to illuminate with a laser beam. The laser drive unit is configured to drive the light source unit. The generation unit is configured to generate adjustment information to adjust a first clock indicating a timing of illumination of a laser beam to scan on a screen, based on a scanning position to be scanned by the laser beam. The adjustment unit is configured to adjust the first clock to a second clock different from the first clock, based on the adjustment information. The laser control unit is configured to control the laser drive unit to drive the light source unit in synchronization with the second clock.

According to this embodiment of the present disclosure, adjustment information, for adjusting a first clock indicating a timing of illumination of a laser beam to scan on a screen, is generated on the basis of a scanning position to be scanned by the laser beam. On the basis of the adjustment information, the first clock is adjusted to a second clock which is different from the first clock. A laser drive unit which drives a light source unit to illuminate with the laser beam is controlled and the light source unit is driven, in synchronization with the second clock.

The embodiments of the present disclosure make it possible to prevent luminance non-uniformity of an image to be projected on a screen.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 5 is a diagram showing an example of a process performed by the scanner drive circuit shown in FIG. 2;

FIG. 12 is a diagram showing an example of a table held by the RAM of the delay generation circuit shown in FIG. 9;

DETAILED DESCRIPTION OF EMBODIMENTS

Hereinafter, an embodiment of the present disclosure (hereinafter referred to as "this embodiment") will be described with reference to the drawings. The description will be given in the following order:
1. This Embodiment
2. Variations 1. This Embodiment

[Configuration Example of Projection Apparatus 11]

Figure 1:
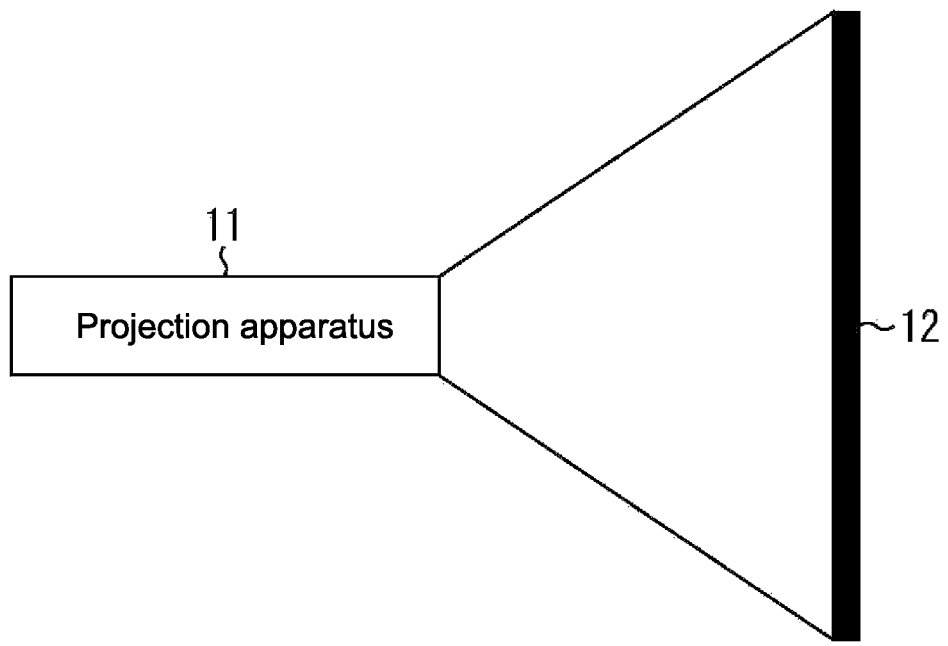
FIG. 1 is a block diagram showing a configuration example of a projection apparatus of an embodiment of the present disclosure.

FIG. 1 shows a configuration example of a projection apparatus 11 of this embodiment.

This projection apparatus 11 prevents luminance non-uniformity of an image to be projected on a screen 12 by projecting pixels at even intervals irrespective of a scanning speed at which a laser beam is allowed to scan on the screen 12, for example.

More specifically, the scanning speed by the projection apparatus 11 becomes the fastest when a scanning position, which represents a position of the laser beam to scan on the screen 12, is in the center of the screen 12. As the scanning position becomes nearer to an edge of the screen 12, the scanning speed becomes slower.

Thus, in cases where the projection apparatus 11 projects the pixels in synchronization with a fixed pixel clock which generates rising edges at regular intervals, an interval between adjacent pixels becomes wider in the center of the screen 12, and as the pixels become nearer to the edge of the screen 12, the interval therebetween becomes narrower.

In response to this, the projection apparatus 11 adjusts the fixed pixel clock, on the basis of the scanning position on the screen 12. Then, by controlling laser so as to allow illumination of the laser beam in synchronization with a variable pixel clock which is the fixed pixel clock after adjustment, for example, the projection apparatus 11 projects the pixels at even intervals to prevent the luminance non-uniformity.

To the screen 12, it projects a projection image with the light corresponding to the laser beam serving as the pixels, by the laser beam emitted from the projection apparatus 11.

[Detail of Projection Apparatus 11]

Figure 2:
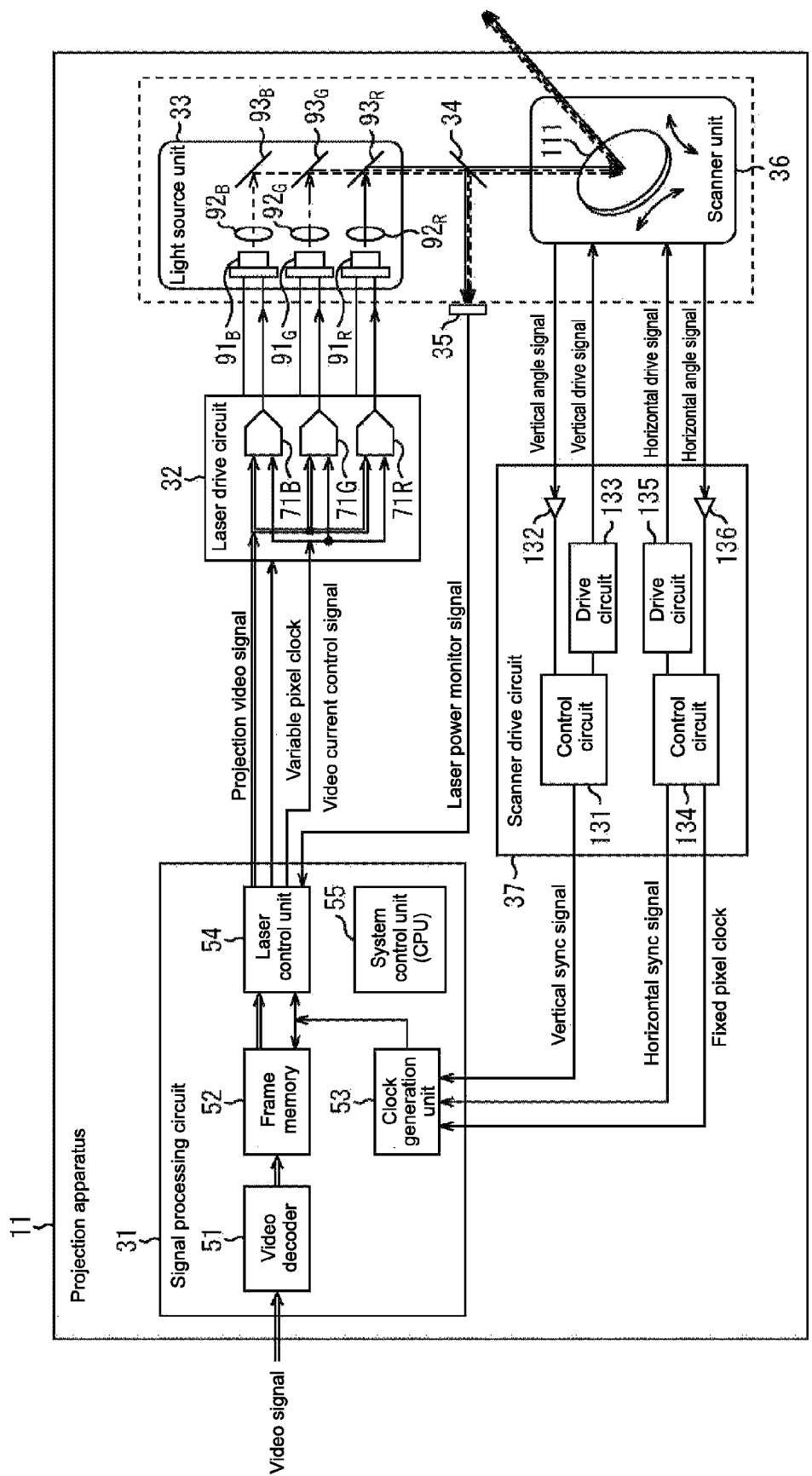
FIG. 2 is a block diagram showing a detailed configuration example of the projection apparatus of FIG. 1.

FIG. 2 shows a detailed configuration example of the projection apparatus 11.

The projection apparatus 11 includes a signal processing circuit 31, a laser drive circuit 32, a light source unit 33, a beam splitter 34, a light-receiving element 35, a scanner unit 36 and a scanner drive circuit 37. In FIG. 2, in order to distinguish it from the configuration of a signal processing system, the configuration of an optical system, that is, the light source unit 33, the beam splitter 34 and the scanner unit 36, are surrounded by a dotted line.

The signal processing circuit 31 generates a projection video signal based on a video signal externally provided. This projection video signal is a video signal depending on the properties such as wavelength of the laser beam which illuminates on the screen. The projection video signal is used when driving the laser drive circuit 32.

In other words, for example, the signal processing circuit 31 includes a video decoder 51, a frame memory 52, a clock generation unit 53, a laser control unit 54 and a system control unit 55.

The video decoder 51 performs color gamut conversion on the externally provided video signal to make it match the respective wavelengths of light sources in the light source unit 33, and supplies the video signal after the color gamut conversion to the frame memory 52, thereby allowing the frame memory 52 to hold it.

The frame memory 52 holds the video signal after the color gamut conversion supplied from the video decoder 51. The frame memory 52 supplies the video signal it holds to the laser control unit 54, in synchronization with the variable pixel clock coming from the clock generation unit 53.

Further, the frame memory 52 prepares a video signal of the next frame as an output video signal to the laser control unit 54 in synchronization with a vertical sync signal, and supplies the prepared video signal to the laser control unit 54 in synchronization with a variable pixel clock coming from the clock generation unit 53.

The clock generation unit 53 generates the variable pixel clock, based on a horizontal sync signal and a fixed pixel clock coming from the scanner drive circuit 37. Then, the clock generation unit 53 supplies the generated variable pixel clock to the frame memory 52 and the laser control unit 54.

It should be noted that the detail of how the clock generation unit 53 generates the variable pixel clock will be described more specifically later with reference to FIGS. 9 to 12 and the like, for example.

Further, the clock generation unit 53 supplies the vertical sync signal coming from the scanner drive circuit 37, to the frame memory 52 and the laser control unit 54.

The laser control unit 54 acquires a laser power monitor signal coming from the light-receiving element 35. Then, the laser control unit 54 monitors the respective optical powers of the light sources in the light source unit 33 on the basis of the acquired laser power monitor signal. The laser control unit 54 generates a projection video signal, for each color, from the video signal coming from the frame memory 52, based on a result of monitoring.

The laser control unit 54 controls illumination of the laser beam by controlling the laser drive circuit 32 in synchronization with the variable pixel clock coming from the clock generation unit 53.

In other words, for example, the laser control unit 54 supplies the projection video signal generated for each color, together with the variable pixel clock from the clock generation unit 53 and with a video current control signal, to the laser drive circuit 32, in synchronization with the variable pixel clock from the clock generation unit 53.

In addition, the laser control unit 54 controls the laser drive circuit 32 in synchronization with the vertical sync signal coming from the clock generation unit 53 so that the illumination of the laser beam is not performed during blanking intervals which will be described later in FIG. 3.

The system control unit 55 includes a CPU (Central Processing Unit), for example. The system control unit 55 controls the circuits that make up the projection apparatus 11.

The laser drive circuit 32 generates a laser drive current for driving the light source unit 33, using the projection video signal coming from the signal processing circuit 31, in synchronization with the variable pixel clock coming from the signal processing circuit 31.

Then, by supplying the generated laser drive current to the light source unit 33, the laser drive circuit 32 controls the light source unit 33 so that the laser beam of each color is output from the light source unit 33.

That is, for example, the laser drive circuit 32 includes laser drive units 71B, 71G and 71R; while the light source unit 33 includes laser light sources 91B, 91G, 91R, collimating lenses 92B, 92G, 92R and dichroic mirrors 93B, 93G, 93R.

In synchronization with the variable pixel clock coming from the laser control unit 54, and on the basis of the projection video signal which is also supplied from the laser control unit 54, the laser drive units 71B, 71G and 71R generate the laser drive currents of the respective colors and supply them to the laser light sources 91B, 91G and 91R, respectively.

Incidentally, in cases where the projection video signal input is a digital signal, the projection video signal as the digital signal is converted into an analog signal by A/D (Analog-to-Digital) conversion, and the full-scale current in this A/D conversion would be controlled based on the video current control signal coming from the laser control unit 54.

That is, for example, the laser drive unit 71B generates the laser drive current for controlling the laser light source 91B, based on the projection video signal for blue coming from the laser control unit 54, and drives the laser light source 91B by supplying the generated laser drive current thereto. Thus, the laser light source 91B emits a blue laser beam based on the laser drive current coming from the laser drive unit 71B. Further, the laser drive unit 71G generates the laser drive current for controlling the laser light source 91G, based on the projection video signal for green coming from the laser control unit 54, and drives the laser light source 91G by supplying the generated laser drive current thereto. Thus, the laser light source 91G emits a green laser beam based on the laser drive current coming from the laser drive unit 71G. The laser drive unit 71R generates the laser drive current for controlling the laser light source 91R, based on the projection video signal for red coming from the laser control unit 54, and drives the laser light source 91R by supplying the generated laser drive current thereto. Thus, the laser light source 91R emits a red laser beam based on the laser drive current coming from the laser drive unit 71R.

The laser light source 91B emits the blue laser beam under the control of the laser drive unit 71B, the collimating lens 92B optically corrects an illumination direction of the laser beam emitted from the laser light source 91B, and the dichroic mirror 93B reflects the blue laser beam after the correction.

The laser light source 91G emits the green laser beam under the control of the laser drive unit 71G, the collimating lens 92G optically corrects an illumination direction of the laser beam emitted from the laser light source 91G, and the dichroic mirror 93G reflects the green laser beam after the correction. In addition, the dichroic mirror 93G transmits the blue laser beam which has been reflected by the dichroic mirror 93B.

The laser light source 91R emits the red laser beam under the control of the laser drive unit 71R, the collimating lens 92R optically corrects an illumination direction of the laser beam emitted from the laser light source 91R, and the dichroic mirror 93R reflects the red laser beam after the correction. In addition, the dichroic mirror 93R transmits the blue laser beam which has been reflected by the dichroic mirror 93B and the green laser beam which has been reflected by the dichroic mirror 93G.

In addition, the laser light sources 91B, 91G, 91R, the collimating lenses 92B, 92G, 92R and the dichroic mirrors 93B, 93G, 93R are arranged in such a manner that the optical axes of the respective laser beams emitting from the laser light sources 91B, 91G and 91R are coaxial. Therefore, the light source unit 33 emits the laser beams of the respective colors in a form of a single laser beam to the beam splitter 34.

The beam splitter 34 is disposed on the way of the optical path of the laser beam emitted from the light source unit 33 to the scanner unit 36. The beam splitter 34 transmits the laser beam coming from the light source 33 and reflects a part of the laser beam toward the direction of the light-receiving element 35.

The light-receiving element 35 receives the light of the laser beam from the beam splitter 34, and detects the respective optical outputs (optical powers) of the laser light sources 91B, 91G and 91R of the light source unit 33, based on the light-receiving results. Then, the light-receiving element 35 supplies the detected results, as the laser power monitor signal, to the laser control unit 54 of the signal processing circuit 31.

The scanner unit 36 has a tiny driving mirror 111 formed by MEMS (Micro Electro Mechanical Systems) built therein. The scanner unit 36 drives the built-in driving mirror 111 in such a manner that the laser beam coming from the light source unit 33 is allowed to scan on the screen 12 in the horizontal direction, based on a horizontal drive signal coming from the drive circuit 37.

Further, the scanner unit 36 drives the built-in driving mirror 111 in such a manner that the laser beam coming from the light source unit 33 is allowed to scan on the screen 12 in the vertical direction, based on a vertical drive signal coming from the drive circuit 37.

The scanner unit 36 further has an angle sensor (not shown) built therein, which angle sensor is for detecting the respective illumination angles in the horizontal and vertical directions of the driving mirror 111. The angle sensor (not shown) detects the angle in the horizontal direction (horizontal angle) of the driving mirror 111 and supplies it to the scanner drive circuit 37 as a horizontal angle signal.

Further, the angle sensor (not shown) detects the angle in the vertical direction (vertical angle) of the driving mirror 111 and supplies it to the scanner drive circuit 37 as a vertical angle signal.

The driving mirror 111 reflects the laser beams output from the light source unit 33, and drives so that those laser beams are allowed to scan on the screen 12 in the horizontal and vertical directions. Alternatively, the scanner unit 36 may have a configuration that a driving mirror for scanning in the horizontal direction and a driving mirror for scanning in the vertical direction are separate, in place of the driving mirror 111 configured to perform scanning in the horizontal and vertical directions.

The scanner drive circuit 37 drives the scanner unit 36. The scanner drive circuit 37 generates the vertical sync signal indicating the scanning position in the vertical direction, the horizontal sync signal indicating the scanning position in the horizontal direction and the fixed pixel clock indicating a timing of illumination of the laser beam, and supplies them to the clock generation unit 53 of the signal processing circuit 31.

That is, the scanner drive circuit 37 includes a control circuit 131, a buffer 132, a drive circuit 133, a control circuit 134, a drive circuit 135 and a buffer 136.

The control circuit 131 controls the drive circuit 133 based on the vertical angle signal coming from the buffer 132, and allows the angle of the driving mirror 111 in the vertical direction to be adjusted to a desired angle. Further, the control circuit 131 generates the vertical sync signal based on the vertical angle signal coming from the buffer 132, and supplies it to the clock generation unit 53 of the signal processing circuit 31.

The buffer 132 holds the vertical angle signal coming from the angle sensor (not shown) of the scanner unit 36, and outputs it to the control circuit 131.

The drive circuit 133 controls the drive of the driving mirror 111 in the vertical direction, by supplying the vertical drive signal for driving the driving mirror 111 in the vertical direction to the scanner unit 36, under the control of the control circuit 131.

The control circuit 134 controls the drive circuit 135 based on the horizontal angle signal coming from the buffer 136, and allows the angle of the driving mirror 111 in the horizontal direction to be adjusted to a desired angle. Further, the control circuit 134 generates the horizontal sync signal and the fixed pixel clock, based on the horizontal angle signal coming from the buffer 136, and supplies them to the clock generation unit 53 of the signal processing circuit 31.

The drive circuit 135 controls the drive of the driving mirror 111 in the horizontal direction, by supplying the horizontal drive signal for driving the driving mirror 111 in the horizontal direction to the scanner unit 36, under the control of the control circuit 134.

The buffer 136 holds the horizontal angle signal coming from the angle sensor (not shown) of the scanner unit 36, and outputs it to the control circuit 134.

The projection apparatus 11 is thus configured, and by scanning with the laser beam in the horizontal and vertical directions by the driving mirror 111, a two-dimensional image is allowed to be projected on the screen 12. In addition, examples of methods of laser-beam scanning by the driving mirror 111 include raster scan and Lissajous scan. The projection apparatus 11 employs a raster scan.

A raster scan will be explained with reference to FIG. 3.

Figure 3:
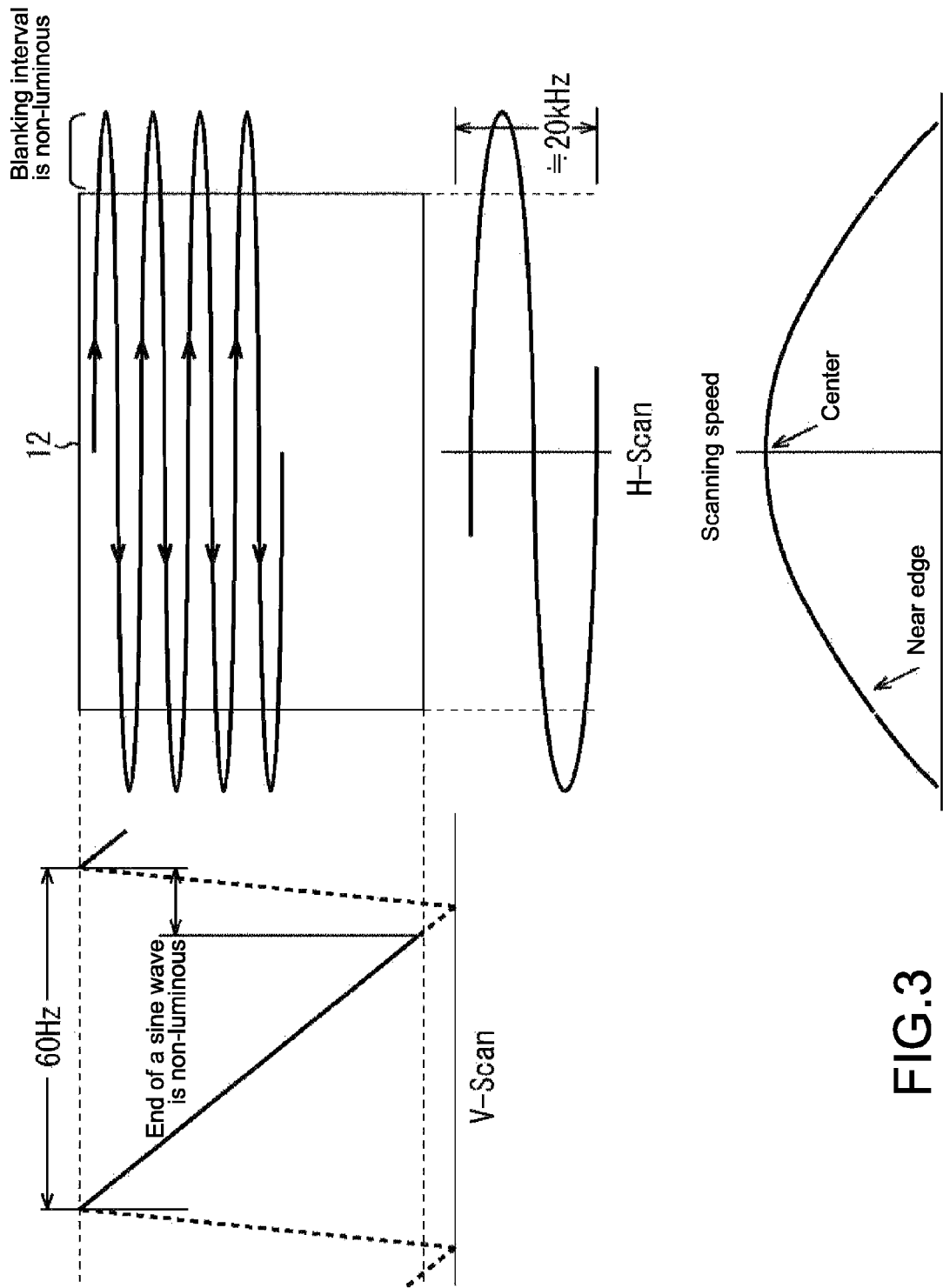
FIG. 3 is a diagram for explaining a raster scan.

In FIG. 3, a scanning path of the laser beam by the raster scan is shown on the screen 12, the horizontal drive signal H-Scan is shown below the screen 12, and the vertical drive signal V-Scan is shown on the left of the screen 12.

The horizontal drive signal H-Scan is, for example, a signal having a sinusoidal waveform which oscillates at about 20 kHz in accordance with the resonance frequency of the driving mirror 111. A frequency of the horizontal drive signal H-Scan is ½ of the horizontal synchronization frequency of an image to be projected on the screen 12 (hereinafter, also referred to as a "projection image"). The vertical drive signal V-Scan is, for example, a signal having a sawtooth waveform which oscillates at about 60 kHz in accordance with the frame period of the projection image.

However, the laser beam does not illuminate the scanning path near both ends of the horizontal drive signal H-Scan, and the portions where the scanning path is bent back are not used for projecting the projection image. In addition, in the interval where the waveform of the vertical drive signal V-Scan is rising substantially vertically, that is, in the blanking interval which is an interval where the scanning path of the laser beam has a sharp change from the bottom toward the top, the laser beam does not illuminate.

By the driving mirror 111 driven in accordance with such a horizontal drive signal H-Scan and a vertical drive signal V-Scan, the laser beam is allowed to scan along the scanning path as shown on the screen 12. As shown in FIG. 3, since the laser beam is made to scan bidirectionally, or in other words, since the direction of the scan by the laser beam is reversed for each row of horizontal scan lines, the projection apparatus 11 needs to perform a process of rearranging the video signal for each row of the scan lines or to change the direction of access to data.

In addition, as shown below the horizontal drive signal H-Scan, while the scanning speed of the laser beam becomes faster in the center of the screen 12, the scanning speed becomes slower near the edge of the screen 12. As a result, it is expected that luminance non-uniformity may occur in the projection image to be projected on the screen 12. Therefore, in the projection apparatus 11, a process for preventing the luminance non-uniformity from occurring, especially near the edge of the screen 12, is carried out. This will be described in detail with reference to FIGS. 6A to 8.

Incidentally, the projection apparatus 11 may adjust a rate of the video signal, as necessary.

Further, since the laser beam is made to scan in accordance with a sine wave, intervals between the horizontal scan lines become non-uniform. Usually, according to a video signal standard, an image is composed of a pixel arrangement in which pixels are arranged in a lattice pattern. Therefore, when a video signal in accordance with the video signal standard is outputted corresponding to the scanning path of the laser beam in accordance with a sine wave, deviations would occur in each pixel of the projection image.

Next, a relationship between the scanning path of the laser beam and the pixel arrangement in accordance with a video signal standard will be explained with reference to FIGS. 4A and 4B.

Figure 4A:
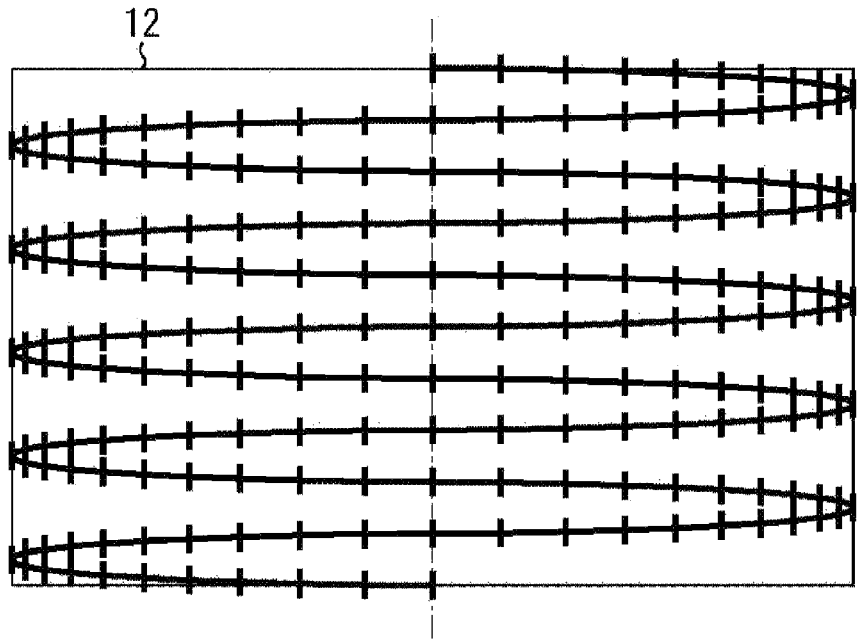
FIGS. 4A and 4B are diagrams for explaining a relationship between a scanning path of a laser beam and a pixel arrangement in accordance with a video signal standard.

FIG. 4A shows a scanning path of a laser beam. In FIG. 4B, the scanning path of the laser beam is shown overlapped with a pixel arrangement in accordance with a video signal standard. It should be noted that FIGS. 4A and 4B describe an example of a case where the bent-back portions of the scanning path are also used for projecting the projection image.

Figure 4B:
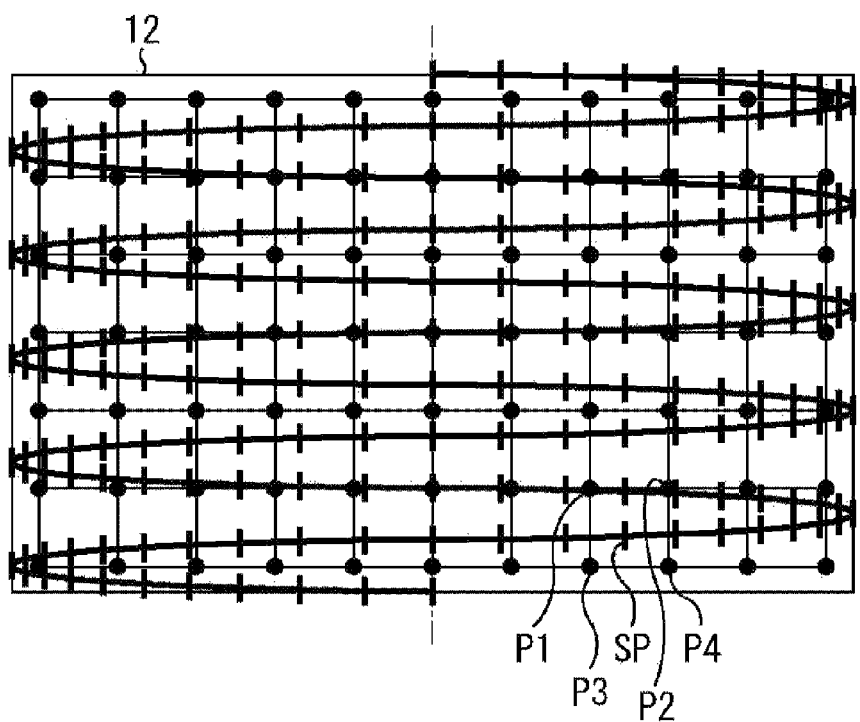

In FIGS. 4A and 4B, the rectangular dots, which are arranged with a predetermined pitch along the scanning path of the laser beam, represent scan-pixels cutting the sinusoidal track of the horizontal drive signal H-Scan at a fixed pixel clock synchronized with the horizontal drive signal H-Scan. In other words, the scan-pixel indicates a timing of a rising edge occurring on a fixed pixel clock, that is, a timing of illumination of the laser beam as a pixel.

As described above with reference to FIG. 3, while the scanning speed of the laser beam becomes faster in the center of the screen 12, the scanning speed becomes slower and the intervals between the horizontal scan lines become non-uniform near the edges of the screen 12. Thus, as shown in FIG. 4A, while the scan-pixels become sparse in the center of the screen 12, the scan-pixels become dense toward the edges, and vertical intervals between the scan-pixels become non-uniform.

Further, in FIG. 4B, the circular dots arranged in a lattice pattern represent pixels arranged by the pixel arrangement in accordance with the video signal standard. As shown in FIG. 4B, the scan-pixel arrangement in accordance with the scanning path of the laser beam significantly differs from the pixel arrangement in accordance with the video signal standard, and also becomes non-uniform in terms of timings. As a result, upon projecting the projection image on the screen 12, deviations would occur in each pixel.

In view of this, in the projection apparatus 11, an interpolation processing, which is to generate pixel values corresponding to the arrangement of the scan-pixels, from pixel values indicated by pixel signals of a plurality of pixels, is carried out so as to avoid the occurrence of deviations in each pixel in the projection image.

A scan-pixel SP shown in FIG. 4B will be described, for example. In the projection apparatus 11, a process of generating a pixel value of a pixel to be projected to the position of the scan-pixel SP from pixel values of four pixels P1 to P4 in the neighborhood of the scan-pixel SP, by two-dimensional interpolation depending on the position of the scan-pixel SP, is performed. By performing such a process on every scan-pixel, it is able to avoid the occurrence of deviations in each pixel in the projection image. It should be noted that a pattern of selection of the pixels to use for generating the pixel value of the pixel to be projected to the position of the scan-pixel SP is not limited to the four pixels P1 to P4 as shown in FIG. 4B. More pixels may be selected and various patterns may be employed as well.

FIG. 5 shows an example of a process performed by the scanner drive circuit 37 of FIG. 2.

An example of the fixed pixel clock which generates rising edges at predetermined intervals is shown in A of FIG. 5. This fixed pixel clock is generated by the control circuit 134, based on the horizontal angle signal indicating the horizontal angle of the driving mirror 111, for example.

An example of the horizontal sync signal which generates a rising edge at a timing of return of the laser beam to a position on the center of the screen 12, when the laser beam is made to scan from the position on the center of the screen 12 left-to-right so as to draw a sine wave of one cycle, is shown in B of FIG. 5. This horizontal sync signal is generated by the control circuit 134, based on the horizontal angle signal indicating the horizontal angle of the driving mirror 111.

An example of the vertical sync signal which generates a rising edge at a timing of switching a frame of a captured image and starting the scan by the laser beam, that is, the timing when the vertical angle becomes the maximum, is shown in C of FIG. 5. This vertical sync signal is generated by the drive circuit 131, based on the vertical angle signal indicating the vertical angle of the driving mirror 111.

An example of the horizontal angle signal during driving the driving mirror 111 in the horizontal direction is shown in D of FIG. 5. This horizontal angle signal indicates the horizontal angle of the driving mirror 111, and is detected by the angle sensor (not shown) built in the scanner unit 36.

Further, the horizontal angle signal shown in D of FIG. 5 indicates the horizontal angle of the driving mirror 111 at a certain time. In D of FIG. 5, the abscissa represents time and the ordinate represents the horizontal angle.

An example of the vertical angle signal during driving the driving mirror 111 in the vertical direction is shown in E of FIG. 5. This vertical angle signal indicates the vertical angle of the driving mirror 111, and is detected by the angle sensor (not shown) built in the scanner unit 36.

Further, the vertical angle signal shown in E of FIG. 5 indicates the vertical angle of the driving mirror 111 at a certain time. In E of FIG. 5, the abscissa represents time and the ordinate represents the vertical angle.

The control circuit 131 generates the vertical drive signal based on such a vertical angle signal as shown in E of FIG. 5 coming from the buffer 132, and supplies it to the drive circuit 133. The drive circuit 133 drives the driving mirror 111, based on the vertical drive signal coming from the control circuit 131. Thus, the vertical angle of the driving mirror 111 is changed by the drive circuit 133 to the vertical angle corresponding to the vertical drive signal.

Further, the control circuit 131 generates such a vertical sync signal as shown in C of FIG. 5 based on such a vertical angle signal as shown in E of FIG. 5 coming from the buffer 132, and supplies it to the clock generation unit 53 of the signal processing circuit 31.

The control circuit 134 generates the horizontal drive signal based on such a horizontal angle signal as shown in D of FIG. 5 coming from the buffer 136, and supplies it to the drive circuit 135. The drive circuit 135 drives the driving mirror 111, based on the horizontal drive signal coming from the control circuit 134. Thus, the horizontal angle of the driving mirror 111 is changed by the drive circuit 135 to the horizontal angle corresponding to the horizontal drive signal.

Further, the control circuit 134 generates such a horizontal sync signal as shown in B of FIG. 5 based on such a horizontal angle signal as shown in D of FIG. 5 coming from the buffer 136, and supplies it to the clock generation unit 53 of the signal processing circuit 31.

In addition, the control circuit 134 generates such a fixed pixel clock as shown in A of FIG. 5, which has higher frequency than the horizontal sync signal, based on such a horizontal angle signal as shown in D of FIG. 5 coming from the buffer 136, and supplies it to the clock generation unit 53 of the signal processing circuit 31.

Figure 6A:
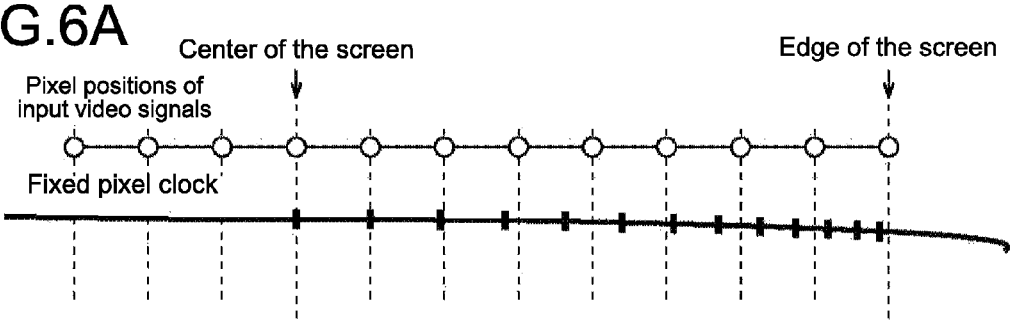
FIGS. 6A to 6C are diagrams showing an example of a case where luminance non-uniformity on the screen occurs when illuminated with a laser beam in synchronization with a fixed pixel clock.
Figure 6B:
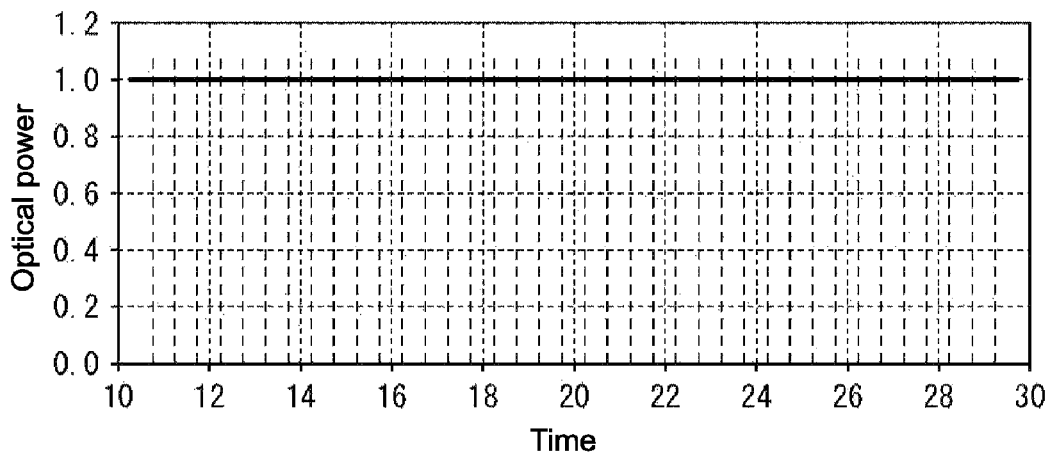
Figure 6C:
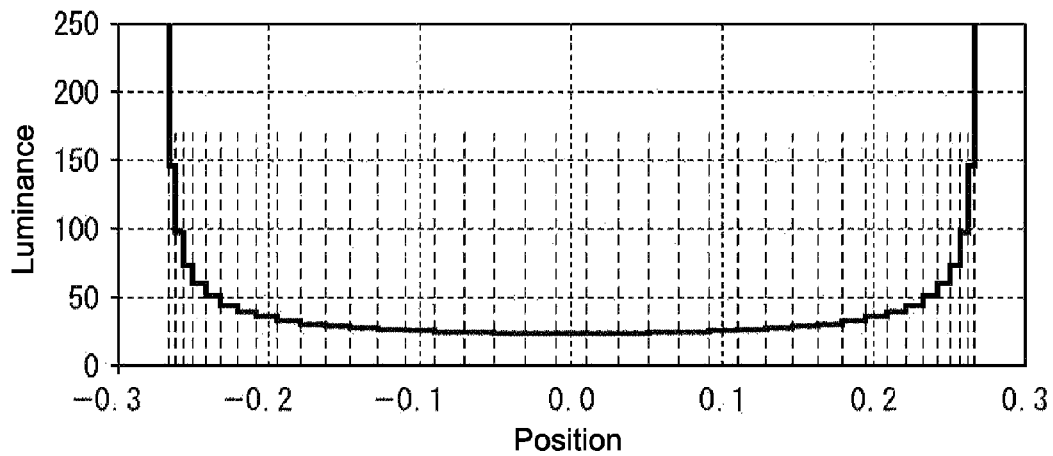

FIGS. 6A to 6C show an example of a case where luminance non-uniformity on the screen 12 occurs when the projection apparatus 11 emits the laser beam in synchronization with the fixed pixel clock.

In FIG. 6A, the white circles represent positions of the pixels corresponding to the video signals input, and the black rectangles represent the timings of the rising edges occurring on the fixed pixel clock.

An optical power (light intensity) of the laser beam emitted from the projection apparatus 11 is shown in FIG. 6B. In FIG. 6B, the abscissa represents time and the ordinate represents the optical power. This will be the same for FIG. 7A.

Further, in FIG. 6B, the timings of the rising edges occurring on the fixed pixel clock, that is, the timings when the illumination of the laser beam as a pixel begins are shown by dotted lines. To distinguish them from dotted lines corresponding to time 12, 14, 16, 18, 20, 22, 24, 26 and 28, the dotted lines which represent the timings of the rising edges are shown by the dotted lines drawn between the points of optical power 0.0 to 1.1. This will be the same for FIG. 7A, which will be described later.

An example of luminance of the pixels to be projected on the screen 12 is shown in FIG. 6C. In FIG. 6C, the abscissa represents the position in the horizontal direction when the position of the center of the screen 12 is 0.0. This position is expressed as a distance [m] from the position of the center of the screen 12. The ordinate represents the luminance. Further, in FIG. 6C, the positions of the pixels are shown by dotted lines. To distinguish them from dotted lines corresponding to position −0.2, −0.1, 0.0, 0.1, 0.2 and 0.3 in FIG. 6C, the dotted lines which represent the positions of the pixels are shown by the dotted lines drawn between the points of luminance 0 to about 170. This will be the same for FIGS. 7B, 13B and 17B.

For example, a case when the projection apparatus 11 emits the laser beam at a constant optical power irrespective of the scanning position on the screen 12 as shown in FIG. 6B is assumed. In this case, the luminance of each pixel of the image projected to the screen 12 is increased sharply in the neighborhood of the edges of the screen 12, as shown in FIG.

6C. This is due to that the positions of the pixels projected in synchronization with the fixed pixel clock become dense, since the scanning speed slows down, in the neighborhood of the edge of the screen 12, as shown in FIG. 6A.

As shown in FIG. 6C, in cases where the projection apparatus 11 emits the laser beam at such a constant optical power as shown in FIG. 6B, the luminance may differ between a position near the center and one near the edge of the screen 12, and it may cause luminance non-uniformity.

Figure 7A:
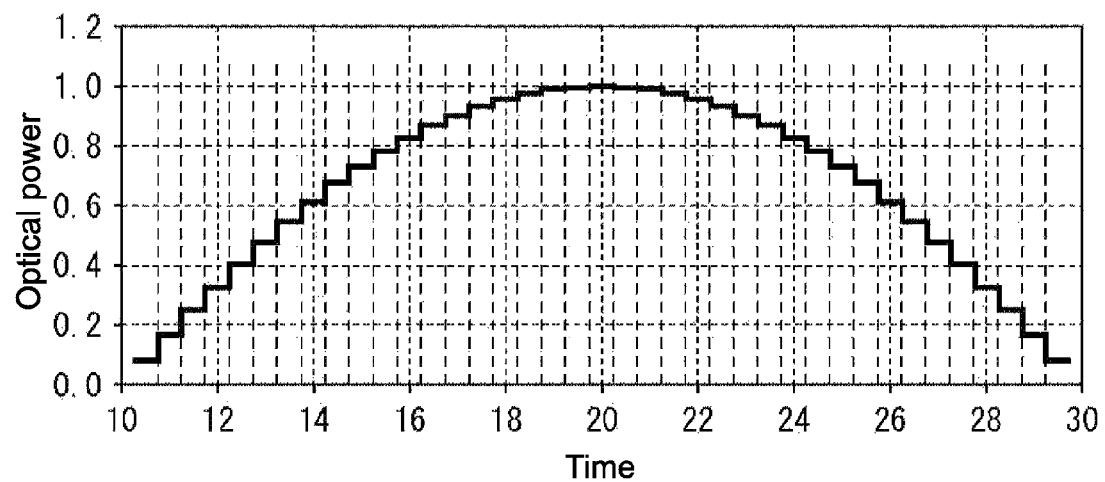
FIGS. 7A and 7B are diagrams showing an example of a case where luminance non-uniformity on the screen is prevented from occurring, by varying an optical power of the laser beam, when illuminated with a laser beam in synchronization with a fixed pixel clock.
Figure 7B:
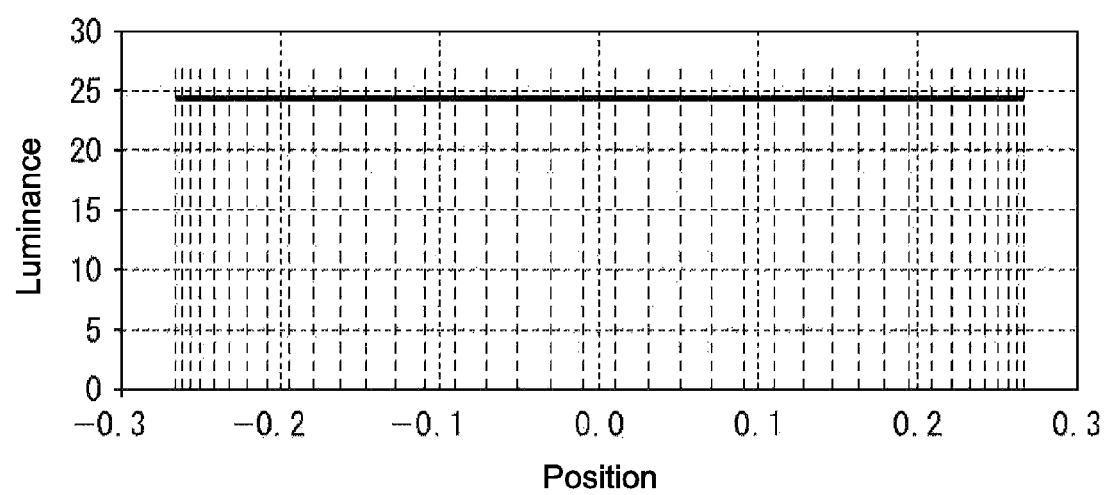

FIGS. 7A and 7B show an example of a case where luminance non-uniformity on the screen 12 is prevented from occurring, by varying an optical power of the laser beam, when the projection apparatus 11 emits the laser beam in synchronization with the fixed pixel clock.

As shown in FIG. 7A, the projection apparatus 11 lowers the optical power of the laser beam as approaching the edge of the screen 12, in synchronization with the fixed pixel clock. This allows the projection apparatus 11 to make the luminance substantially the same irrespective of the scanning position on the screen 12 at which the pixel is projected, as shown in FIG. 7B, and thus the luminance non-uniformity can be suppressed.

However, when varying the optical power of the laser beam in such a manner as shown in FIG. 7A, while it is able to suppress luminance non-uniformity, for example, more complicated control should be performed than in the case of emitting the laser beam at the same optical power irrespective of the scanning position. Consequently, effective bit-width would be used more in order to perform such a complicated control, and the effective bit-width for expressing the gradation and the like of the projection image would be decreased to lower the quality (such as resolution) of the projection image.

Further, every time the scanning position changes, it is necessary to perform switching of the optical power of the laser beam, and this would increase the power consumption. In particular, as it becomes nearer to the edge of the screen 12, the switching is performed more frequently and the power consumption becomes more significant.

In addition, when the projection apparatus 11 emits the laser beam in synchronization with the fixed pixel clock, radiation noise by a frequency component of the fixed pixel clock which is of a constant frequency would be increased. Consequently, for example, in order to make the projection apparatus 11 so that it conforms to EMI (Electro-Magnetic Interference) standard, it may need a shielding member or the like for blocking the radiation noise, which leads to an increase in production cost of the projection apparatus 11, and an enlargement of a housing thereof.

In view of this, the projection apparatus 11 is configured to adjust the fixed pixel clock depending on the scanning position on the screen 12, and to emit the laser beam in synchronization with the fixed pixel clock after adjustment (variable pixel clock). It is thus configured to prevent the occurrence of luminance non-uniformity on the screen 12.

Figure 8:
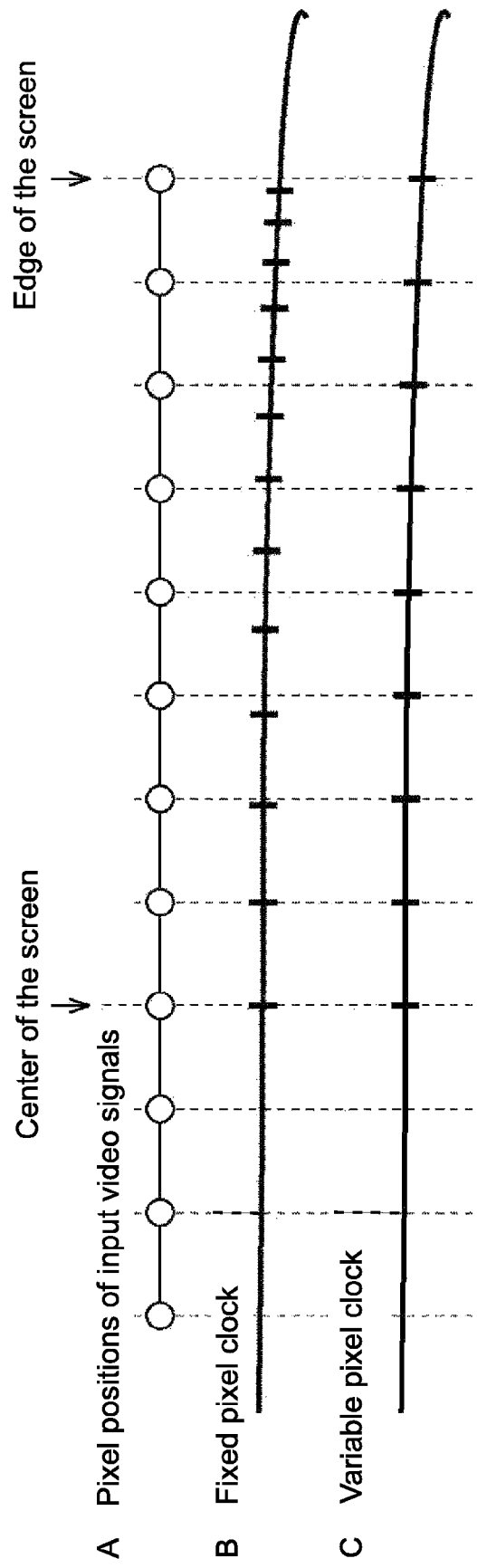
FIG. 8 is a diagram showing an example of timings of rising edges occurring on a fixed pixel clock and timings of rising edges occurring on a variable pixel clock.

FIG. 8 shows an example of timings of rising edges occurring on a fixed pixel clock and timings of rising edges occurring on a variable pixel clock.

In A of FIG. 8, the white circles represent positions of the respective pixels corresponding to the video signals input to the projection apparatus 11 from the outside, that is, a pixel arrangement in accordance with a video signal standard.

In B of FIG. 8, the rectangles represent the timings of the rising edges occurring on the fixed pixel clock. In B of FIG. 8, the pixels are projected in a state of being closer to each other, as the positions thereof become nearer to the edge of the screen 12.

In C of FIG. 8, the rectangles represent the timings of the rising edges occurring on the variable pixel clock. In C of FIG. 8, the pixels are projected on the screen 12 at even intervals.

The projection apparatus 11 adjusts the fixed pixel clock on the basis of the scanning position of the laser beam, in such a manner as shown in C of FIG. 8 for example, so that the pixels can be projected at even intervals. Then, the projection apparatus 11 emits the laser beam in synchronization with the fixed pixel clock after adjustment (variable pixel clock), thereby projecting the pixels at even intervals. Thus, it is able to prevent the occurrence of luminance non-uniformity on the screen 12.

[Detail of Clock Generation Unit 53]

Figure 9:
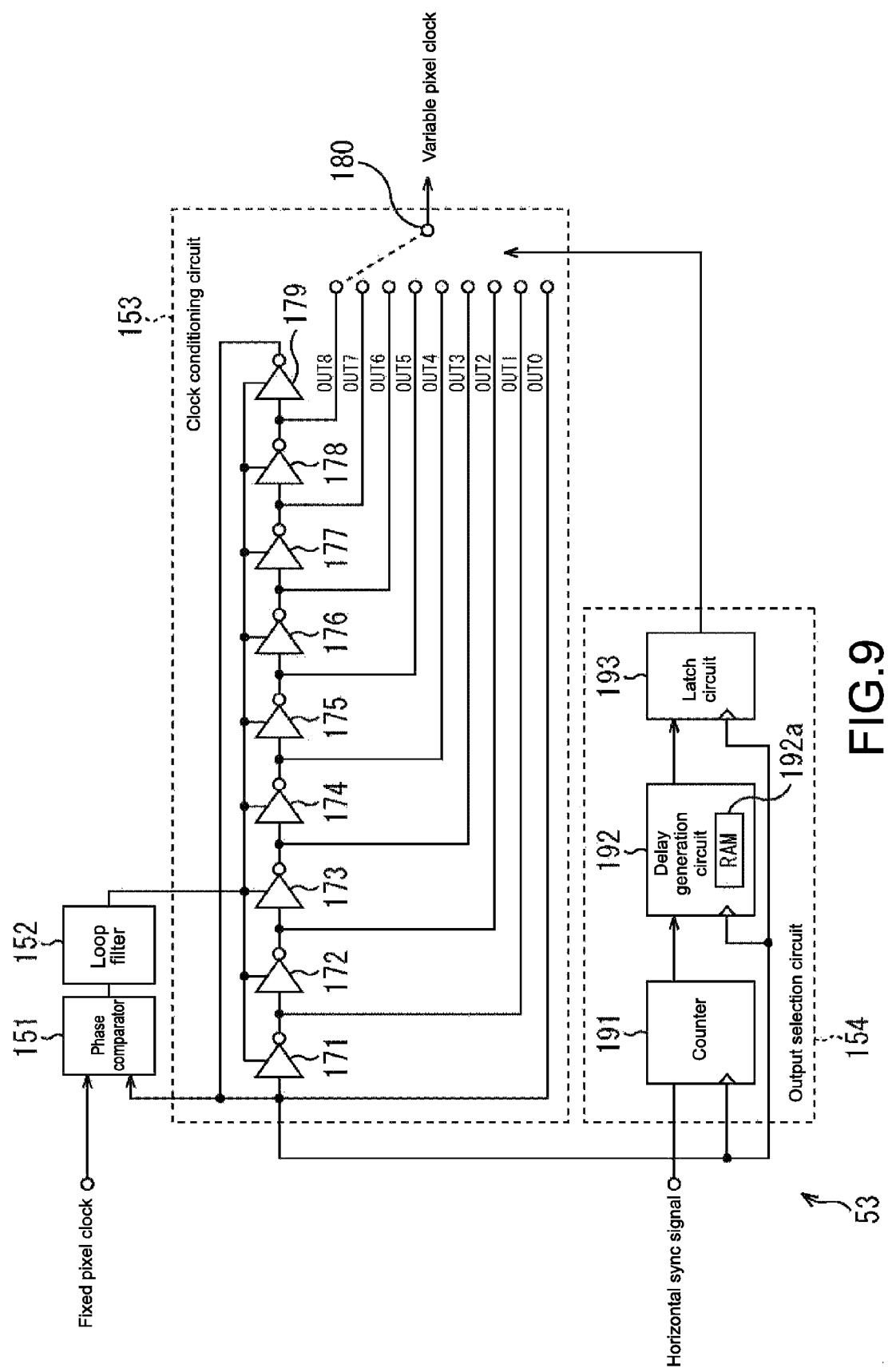
FIG. 9 is a block diagram showing a detailed configuration example of the clock generation unit shown in FIG. 2.

FIG. 9 shows a detailed configuration example of the clock generation unit 53.

The clock generation unit 53 includes a phase comparator 151, a loop filter 152, a clock conditioning circuit 153 and an output selection circuit 154.

To the phase comparator 151, a fixed pixel clock is supplied from the control circuit 134 of the scanner drive circuit 37 of FIG. 2. The phase comparator 151 compares the fixed pixel clock coming from the control circuit 134 with an output fed back from the clock conditioning circuit 153, and supplies the result of the comparison to the loop filter 152.

The loop filter 152 performs LPF (Low Pass Filter) processing on the result of the comparison coming from the phase comparator 151, to remove the high frequency component therefrom, and supplies the result of the comparison after LPF to the clock conditioning circuit 153.

The clock conditioning circuit 153 adjusts the fixed pixel clock, based on output selection information for adjusting the fixed pixel clock, coming from the output selection circuit 154. The clock conditioning circuit 153 outputs the fixed pixel clock after adjustment as a variable pixel clock.

That is, for example, the clock conditioning circuit 153 is a ring oscillator which includes nine inverters 171 to 179 and a switch 180. The inverters 171 to 179 are capable of adjusting a delay (delay time) by which the fixed pixel clock is delayed, depending on the result of the comparison after LPF, coming from the loop filter 152. With such a configuration, the clock conditioning circuit 153 may configure a PLL (Phase Locked Loop) circuit. Thus, the clock conditioning circuit 153 as the ring oscillator oscillates with the same frequency and phase as the fixed pixel clock, and outputs a waveform OUT0 (described later in FIG. 10) having the same frequency and phase as the fixed pixel clock.

It should be noted that the number of the inverters in the clock conditioning circuit 153 is not limited to nine but may be any odd number. In addition, a ring oscillator as the clock conditioning circuit 153 may have a differential circuit configuration. In this case, the ring oscillator may be composed of an odd number of inverters, and in addition, the ring oscillator may be composed of an even number of inverters as well.

The inverters 171 to 179 delay the fixed pixel clock, which is supplied to the phase comparator 151 from the control circuit 134 of the scanner drive circuit 37 of FIG. 2, by the respective predetermined delays (delay times), based on the result of the comparison after LPF from the loop filter 152. Then, the inverters 171 to 179 output the delayed fixed pixel clocks delayed by the respective predetermined delays.

Figure 10:
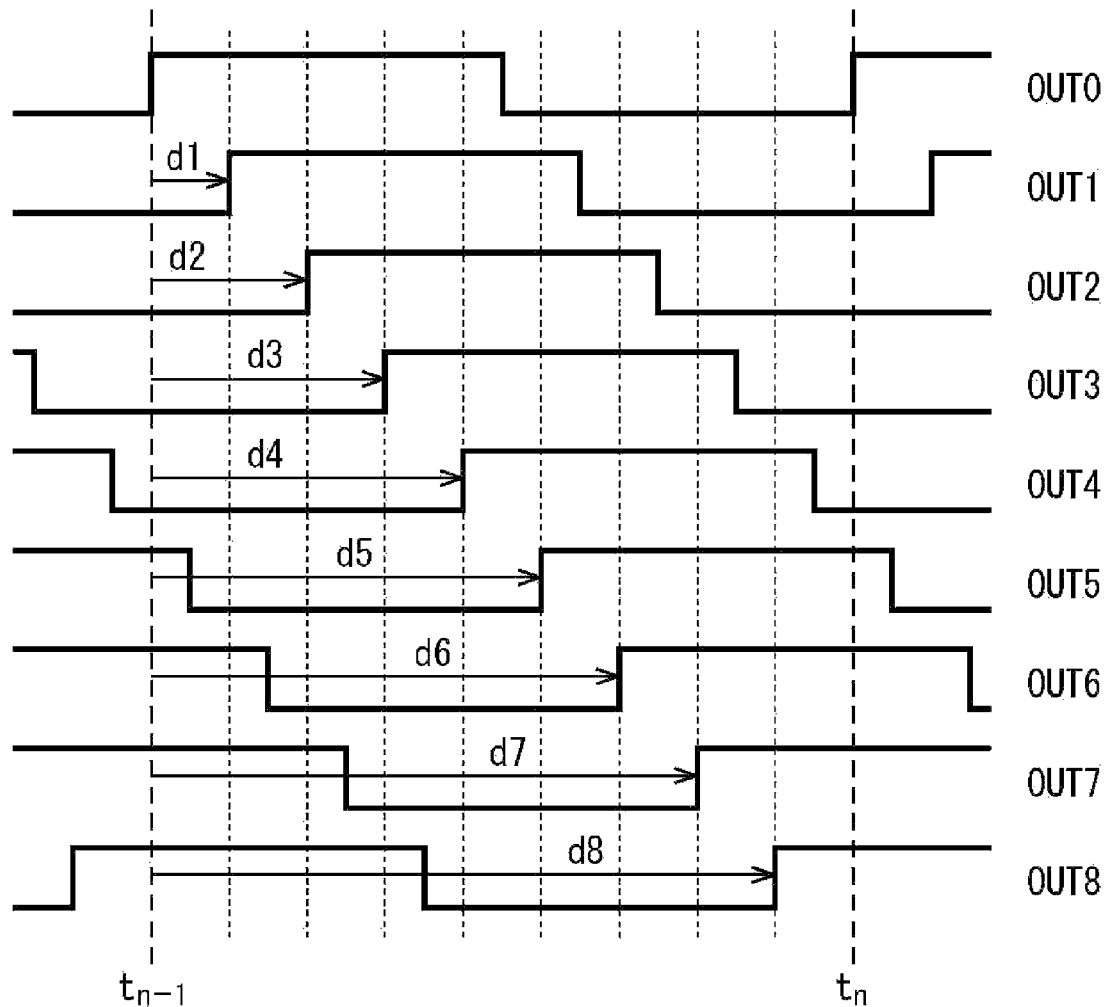
FIG. 10 is a diagram showing an example of waveforms of fixed pixel clocks output from the respective inverters shown in FIG. 9.

FIG. 10 shows an example of waveforms OUT0 to OUT8 of the respective fixed pixel clocks output from the inverters 171 to 179.

In FIG. 10, in the order from the top, the waveform OUT0 output from the inverter 179, the waveform OUT1 output from the inverter 171, the waveform OUT2 output from the inverter 172 and the waveform OUT3 output from the inverter 173 are shown. Further, the waveform OUT4 output from the inverter 174, the waveform OUT5 output from the inverter 175, the waveform OUT6 output from the inverter 176, the waveform OUT7 output from the inverter 177 and the waveform OUT8 output from the inverter 178 are shown in FIG. 10. In FIG. 10, a period from time $t_{n-1}$ to time $t_n$ indicates a period from the time that a rising edge $t_{n-1}$ occurs until the next rising edge $t_n$ occurs, on the fixed pixel clock.

The waveform OUT0 is a waveform which generates a rising edge with the same timing as the fixed pixel clock. The waveform OUT1 is a waveform which generates a rising edge with a timing which is delayed from the fixed pixel clock by a delay d1. Similarly, the waveforms OUT2, OUT3, OUT4, OUT5, OUT6, OUT7 and OUT8 are waveforms which generate rising edges with timings which are delayed from the fixed pixel clock by delays d2, d3, d4, d5, d6, d7 and d8, respectively.

In FIG. 10, the amounts of the delays are d2=2×d1, d3=3×d1, d4=4×d1, d5=5×d1, d6=6×d1, d7=7×d1 and d8=8×d1.

The inverter 171 delays the fixed pixel clock OUT0 coming from the inverter 179 by a predetermined delay (delay time) and outputs the delayed fixed pixel clock OUT1 to the inverter 172 and the switch 180.

Similarly, the inverter 172 delays the fixed pixel clock OUT1 coming from the inverter 171 by a predetermined delay and outputs the delayed fixed pixel clock OUT2 to the inverter 173 and the switch 180. The inverter 173 delays the fixed pixel clock OUT2 coming from the inverter 172 by a predetermined delay and outputs the delayed fixed pixel clock OUT3 to the inverter 174 and the switch 180. The inverter 174 delays the fixed pixel clock OUT3 coming from the inverter 173 by a predetermined delay and outputs the delayed fixed pixel clock OUT4 to the inverter 175 and the switch 180. The inverter 175 delays the fixed pixel clock OUT4 coming from the inverter 174 by a predetermined delay and outputs the delayed fixed pixel clock OUT5 to the inverter 176 and the switch 180. The inverter 176 delays the fixed pixel clock OUT5 coming from the inverter 175 by a predetermined delay and outputs the delayed fixed pixel clock OUT6 to the inverter 177 and the switch 180. The inverter 177 delays the fixed pixel clock OUT6 coming from the inverter 176 by a predetermined delay and outputs the delayed fixed pixel clock OUT7 to the inverter 178 and the switch 180. The inverter 178 delays the fixed pixel clock OUT7 coming from the inverter 177 by a predetermined delay and outputs the delayed fixed pixel clock OUT8 to the inverter 179 and the switch 180.

The inverter 179 delays the fixed pixel clock OUT8 coming from the inverter 178 by a predetermined delay and feeds back (supplies) the delayed fixed pixel clock OUT0 to the phase comparator 151.

Further, the inverter 179 supplies the delayed fixed pixel clock OUT0 to the switch 180, and also supplies it to a counter 191, a delay generation circuit 192 and a latch circuit 193 of the output selection circuit 154.

Referring back to FIG. 9, the switch 180 of the clock conditioning circuit 153 selects the output that is delayed by the delay time corresponding to the output selection information, among the outputs OUT0 to OUT8, based on the output selection information coming from the output selection circuit 154. Then, the switch 180 supplies the selected output, as the variable pixel clock, to the clock generation unit 53 of the signal processing circuit 31 of FIG. 2.

The output selection circuit 154 calculates the scanning position which represents the position of the laser beam to scan on the screen 12, based on the horizontal sync signal coming from the control circuit 134 of the scanner drive circuit 37 of FIG. 2 and the fixed pixel clock OUT0 coming from the clock conditioning circuit 153. Then, the output selection circuit 154 generates the output selection information for adjusting the fixed pixel clock OUT0, based on the calculated scanning position. In other words, for example, the output selection circuit 154 generates the output selection information for delaying the fixed pixel OUT0 by the delay that depends on the scanning position, based on the calculated scanning position.

That is, the output selection circuit 154 includes the counter 191, the delay generation circuit 192 and the latch circuit 193.

The counter 191 resets a count C to 0 upon detecting the rising edge of the horizontal sync signal supplied from the control circuit 134 of the scanner drive circuit 37 of FIG. 2.

Further, the counter 191 determines whether or not the rising edge on the fixed pixel clock OUT0 has occurred. If determined that the rising edge has occurred, it adds 1 to (increment) the count C. Then, the counter 191 outputs the incremented count C to the delay generation circuit 192. In addition, the count C represents the scanning position on the screen 12. That is, for example, the count C=1 may represent the scanning position on the screen 12 at the edge of the screen 12.

Figure 11:
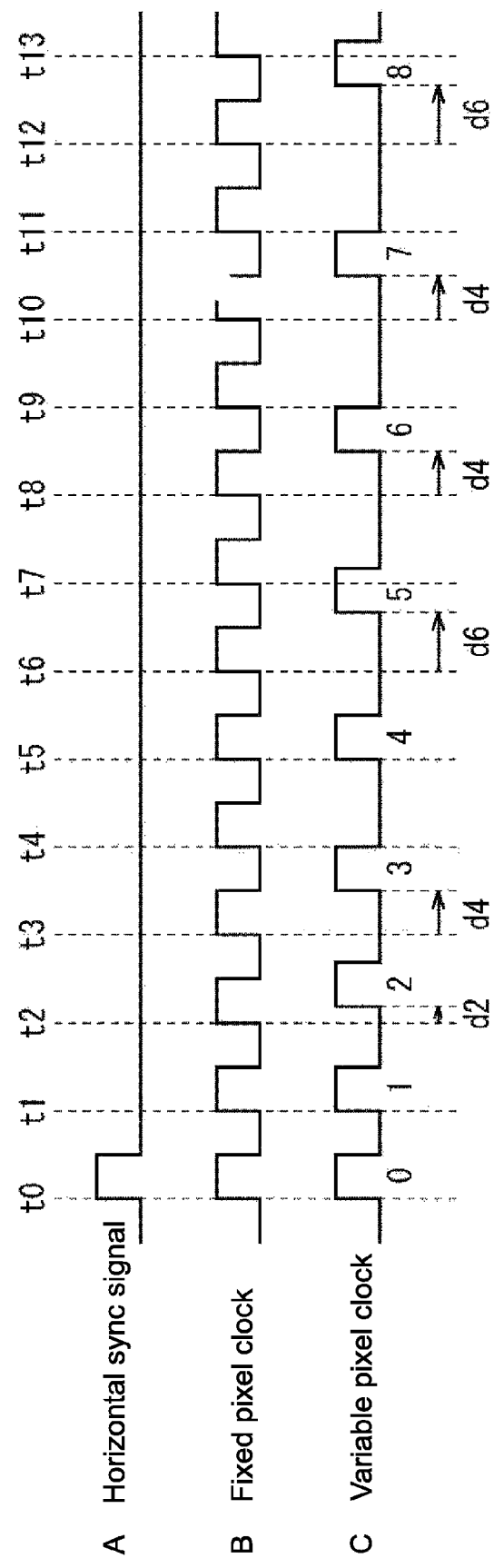
FIG. 11 is a diagram showing an example of a process performed by the counter shown in FIG. 9.

FIG. 11 shows an example of a process performed by the counter 191.

An example of the horizontal sync signal supplied to the counter 191 of the clock generation circuit 53 from the control circuit 134 is shown in A of FIG. 11. This horizontal sync signal generates a rising edge t0 at the time to.

An example of the fixed pixel clock OUT0 supplied to the counter 191 from the clock conditioning circuit 153 is shown in B of FIG. 11. This fixed pixel clock OUT0 generates a rising edge tn at each time tn (n=0, 1, . . . , 13).

An example of the variable pixel clock output from the clock conditioning circuit 153 is shown in C of FIG. 11. This variable pixel clock may be generated by adjusting the timings of the rising edges occurring on the fixed pixel clock OUT0 shown in B of FIG. 11. The variable pixel clock generates rising edges 0 to 8.

For example, the counter 191 resets the count C, which indicates the number of times of the rising edges of the fixed pixel clock OUT0 it has counted, to 0, when the rising edge occurring on the horizontal sync signal (A of FIG. 11) coming from the control circuit 134 is detected. Incidentally, the counter 191 has a built-in memory (not shown) to hold the count C.

Further, every time the counter 191 detects the rising edge tn occurring on the fixed pixel clock OUT0 (B of FIG. 11) coming from the clock conditioning circuit 153, it increases (increments) the count C by 1, and supplies the incremented count C to the delay generation circuit 192.

Thus, for example, in the projection apparatus 11, the scanning position on the screen 12 is determined based on the count C counted from the time when the rising edge of the horizontal sync signal t0 has occurred. On the basis of the result of this determination, such a variable pixel clock as shown in C of FIG. 11 is generated.

Specifically, for example, at the time t0, the count C=1 is given, and the rising edge 0 of the variable pixel clock is delayed from the rising edge t0 of the fixed pixel clock by the delay d0. Since the amount of the delay is d0=0, the rising edge 0 of the variable pixel clock is becomes the same as the rising edge t0 of the fixed pixel clock OUT0.

Further, for example, at the time t1, the count C=2 is given, and the rising edge 1 of the variable pixel clock is delayed from the rising edge t1 of the fixed pixel clock OUT0 by the delay d0 (=0). Still further, for example, at the time t2, the count C=3 is given, and the rising edge 2 of the variable pixel clock is delayed from the rising edge t2 of the fixed pixel clock OUT0 by the delay d2. Similarly, at the time t3, the count C=4 is given, and the rising edge 3 of the variable pixel clock is delayed from the rising edge t3 of the fixed pixel clock OUT0 by the delay d4. At the time t4, the count C=5 is given. Then, at the time t5, the count C=6 is given, and the rising edge 4 of the variable pixel clock is delayed from the rising edge t5 of the fixed pixel clock OUT0 by the delay d0 (=0). At the time t6, the count C=7 is given, and the rising edge 5 of the variable pixel clock is delayed from the rising edge t6 of the fixed pixel clock OUT0 by the delay d6.

At the time t7, the count C=8 is given. Then, at the time t8, the count C=9 is given, and the rising edge 6 of the variable pixel clock is delayed from the rising edge t8 of the fixed pixel clock OUT0 by the delay d4. At the time t9, the count C=10 is given. Then, at the time t10, the count C=11 is given, and the rising edge 7 of the variable pixel clock is delayed from the rising edge t10 of the fixed pixel clock OUT0 by the delay d4. At the time t11, the count C=12 is given. Then, at the time t12, the count C=13 is given, and the rising edge 8 of the variable pixel clock is delayed from the rising edge t12 of the fixed pixel clock OUT0 by the delay d6.

Referring back to FIG. 9, the delay generation circuit 192 generates the output selection information for adjusting the rising edges of the fixed pixel clock OUT0, based on the count C coming from the counter 191, or in other words, the scanning position on the screen 12. The delay generation circuit 192 supplies the output selection information to the latch circuit 193.

That is, for example, the delay generation circuit 192 has a RAM 192a built therein, and the RAM 192a holds a table (corresponding table) which makes the count C and the output selection information representing the delay d correspond to each other.

FIG. 12 shows an example of the table held by the RAM 192a.

In FIG. 12, an example of the table which makes the count C, the fixed pixel clock tn, the output selection information representing the delay d, and the variable pixel clock that is obtained by delaying the fixed pixel clock tn by the delay d correspond to each other is shown.

For convenience of explanation, FIG. 12 shows the count C, the fixed pixel clock tn, the output selection information and the variable pixel clock. However, for example, a table in which the count C corresponds to the output selection information is held by RAM 192a.

The delay generation circuit 192 reads the output selection information that corresponds to the count C from the table held by the RAM 192a, based on the count C coming from the counter 191, and supplies it to the latch circuit 193.

Referring back to FIG. 9, the latch circuit 193 latches the output selection information coming from the delay generation circuit 192, and outputs it to the switch 180 of the clock conditioning circuit 153.

[Example of Using the Variable Clock]

Figure 13A:
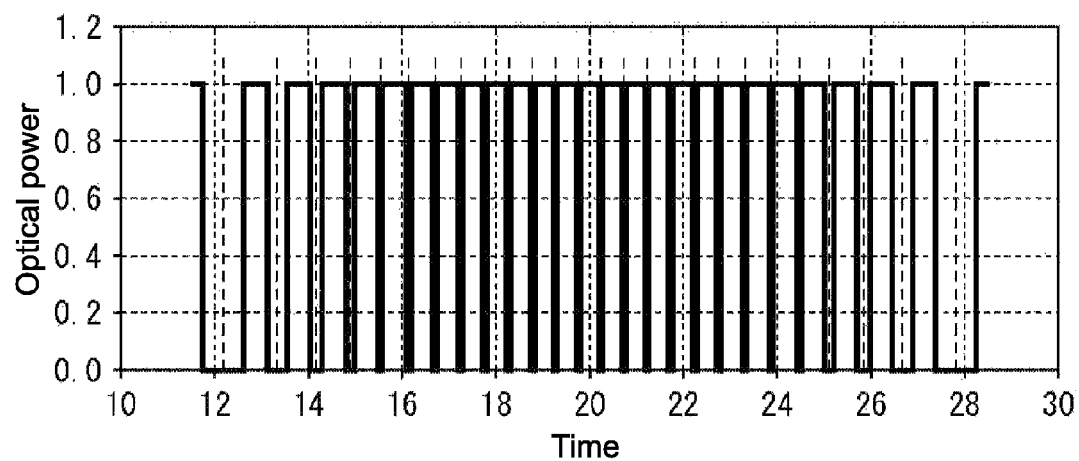
FIGS. 13A and 13B are diagrams showing an example of a case where the projection apparatus emits a laser beam intermittently at the same optical power in synchronization with a variable pixel clock.
Figure 13B:
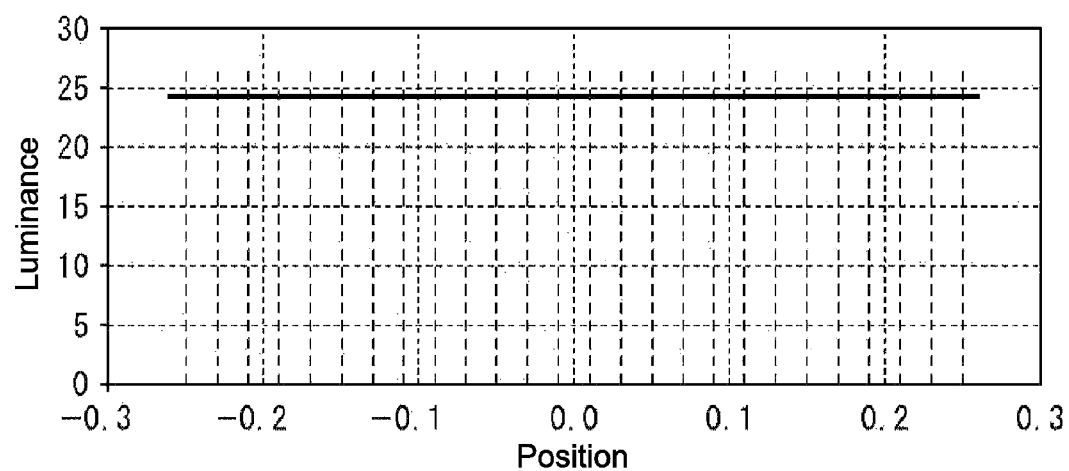

FIGS. 13A and 13B show an example of a case where the projection apparatus 11 emits a laser beam intermittently at a fixed optical power in synchronization with the fixed pixel clock after adjustment, which is the variable pixel clock.

In FIG. 13A, the timings of the rising edges occurring on the variable pixel clock are shown by dotted lines. To distinguish them from dotted lines corresponding to time 12, 14, 16, 18, 20, 22, 24, 26 and 28, the dotted lines which represent the timings of the rising edges of the variable pixel clock are shown by the dotted lines drawn between the points of optical power 0.0 to 1.1. This will be the same for FIG. 17A, which will be described later.

The laser control unit 54 controls the laser drive circuit 32 in synchronization with the variable pixel clock coming from the clock generation unit 53, in such a manner as shown in FIG. 13A, so that the laser beam is emitted with a longer time interval as it becomes nearer to the edge of the screen 12. In other words, the laser drive circuit 32 allows illumination of such a laser beam by driving the light source unit 33, under the control of the laser control unit 54. Thus, the projection apparatus 11 is able to illuminate with the laser beam as pixels at even intervals on the screen 12.

Further, the laser control unit 54 controls the laser drive circuit 32 in synchronization with the variable pixel clock coming from the clock generation unit 53, in such a manner as shown in FIG. 13A, so that the laser beam is emitted at a fixed optical power for a fixed illumination time irrespective of the scanning position and makes a total of optical power (=optical power×illumination time) of the laser beam substantially the same for each pixel projected on the screen 12. In other words, the laser drive circuit 32 allows illumination of such a laser beam by driving the light source unit 33, under the control of the laser control unit 54.

This allows the projection apparatus 11 to make the luminance substantially the same irrespective of the scanning position on the screen 12 at which the pixel is projected, as shown in FIG. 13B, and thus the luminance non-uniformity can be suppressed.

The projection apparatus 11 emits the laser beam at the same (fixed) optical power, in synchronization with the variable pixel clock, as shown in FIG. 13A. Thus, for example, such circumstances where the effective bit-width to be used significantly increases, as in the case of varying the optical power of the laser beam as shown in FIG. 7A, is able to be prevented. Therefore, the effective bit-width can be used as the bit for expressing the gradation and the like of the projection image, and thus it can prevent lowering of the image quality of the projection image.

Further, when the projection apparatus 11 emits the laser beam as pixels at even intervals on the screen 12 in such a manner as shown in FIG. 13A, the switching of the optical power of the laser beam performed near the edge of the screen 12 becomes less frequent than in the case of FIG. 7A, and thus it is able to reduce the power consumption.

In addition, when the projection apparatus 11 emits the laser beam in synchronization with the variable pixel clock, since the variable pixel clock has its frequency component distributed over a broader band range, which is different from the fixed pixel clock, a peak of radiation noise may be suppressed. As a result, it may not need a shielding member or the like for blocking the radiation noise. Therefore, the increase in production cost of the projection apparatus 11 and the enlargement of the housing can be prevented.

In addition, the projection apparatus 11 is made to emit the laser beam in an intermittent manner as shown in FIG. 13A. Thus, the projection apparatus 11 is able to reduce the contribution of current to threshold current by half, which contribution to threshold current is necessary for emitting the laser beam.

Figure 14A:
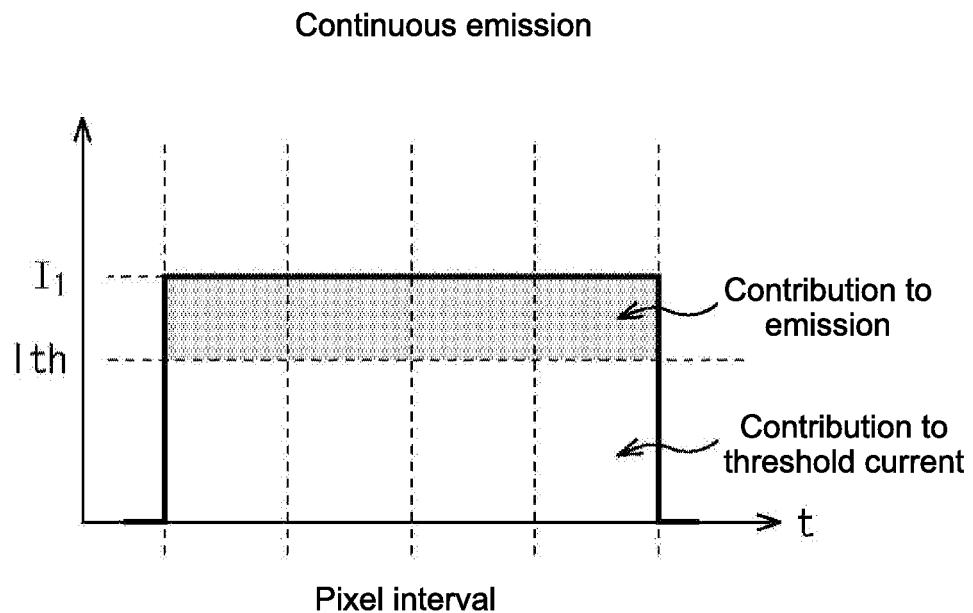
FIGS. 14A and 14B are diagrams to illustrate that an intermittent emission of the laser beam is able to reduce the contribution to threshold current by half compared to continuous emission.
Figure 14B:
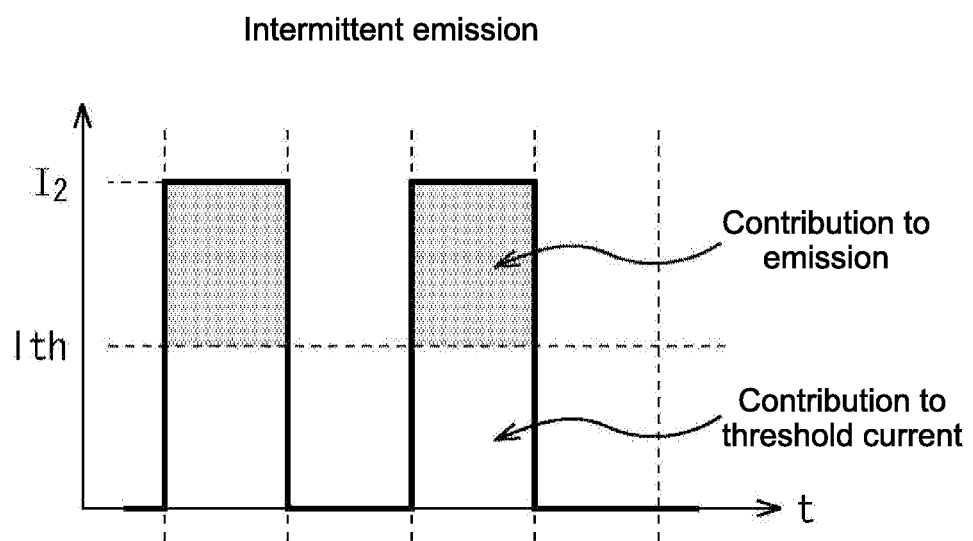

FIGS. 14A and 14B indicate that an intermittent emission of the laser beam is able to reduce the contribution to threshold current by half compared to continuous emission.

Each of the laser light sources 91B, 91G and 91R emits a laser beam at an optical power corresponding to the contribution of current to emission ($I-I_{th}$) when the laser drive current I more than the threshold current $I_{th}$ is supplied thereto.

In other words, FIG. 14A illustrates a case where the laser light sources 91B, 91G and 91R emit the laser beam continuously based on the laser drive current $I=I_1$.

FIG. 14B illustrates a case where the laser light sources 91B, 91G and 91R emit the laser beam intermittently based on the laser drive current $I=I_2$. The currents satisfy $I_2>I_1$.

In the case where the projection apparatus 11 emits the laser beam intermittently as shown in FIG. 14B, it is able to reduce the contribution to the threshold current by half, maintaining the same contribution to emission, as compared to the case of emitting the laser beam continuously as shown in FIG. 14A.

Thus, in the case where the projection apparatus 11 emits the laser beam intermittently, it is able to reduce the power consumption by the threshold current while maintaining the contribution to emission.

[Description of Operation of Projection Apparatus 11]

Figure 15:
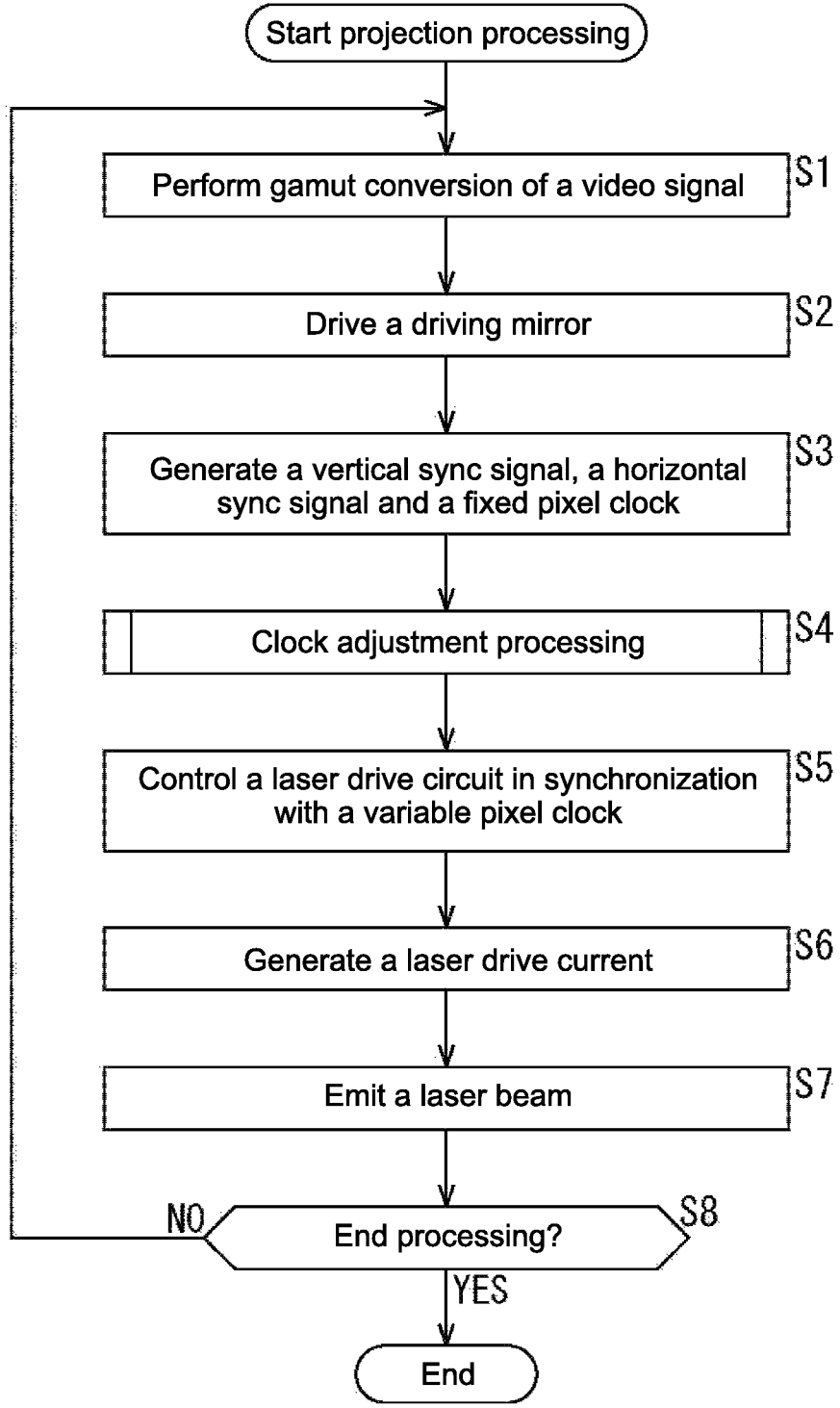
FIG. 15 is a flowchart for explaining a process of projection performed by the projection apparatus.

Next, with reference to a flowchart of FIG. 15, projection processing performed by the projection apparatus 11 will be described.

This projection processing is started when a video signal is supplied to the projection apparatus 11 from the outside, for example.

In the step S1, the video decoder 51 of the signal processing circuit 31 performs gamut conversion on the externally provided video signal to make it match the respective wavelengths of light sources in the light source unit 33, and supplies the video signal after the color gamut conversion to the frame memory 52, thereby allowing the frame memory 52 to hold it. The frame memory 52 supplies the video signal after the color gamut conversion it holds, to the laser control unit 54 in synchronization with a variable pixel clock coming from the clock generation unit 53. This variable pixel clock is obtainable from a clock adjustment processing of the step S4, which will be described later.

In the step S2, the scanner drive circuit 37 generates a horizontal drive signal, based on a horizontal angle signal coming from the angle sensor (not shown) built in the scanner unit 36, and supplies it to the scanner unit 36. Further, the scanner drive circuit 37 generates a vertical drive signal, based on a vertical angle signal coming from the angle sensor (not shown) built in the scanner unit 36, and supplies it to the scanner unit 36.

Then, the scanner unit 36 drives the built-in driving mirror 111 in such a manner that the laser beam coming from the light source unit 33 is allowed to scan on the screen 12 in the horizontal and vertical directions, based on the horizontal and vertical drive signals coming from the drive circuit 37. This allows the laser beam to be reflected by the driving mirror 111, to be illuminated on the screen. The illumination with the laser beam is performed by a process of the Step S7, which will be described later.

Further, in the scanner unit 36, the built-in angle sensor (not shown) detects the horizontal and vertical angles of the driving mirror 111, and supplies them to the scanner drive circuit 37 as the horizontal and vertical angle signals, respectively.

In the step S3, the scanner drive circuit 37 generates a horizontal sync signal and a fixed pixel clock, based on the horizontal angle signal coming from the angle sensor (not shown) built in the scanner unit 36, and supplies them to the clock generation unit 53 of the signal processing circuit 31. Further, the scanner drive circuit 37 generates a vertical sync signal, based on the horizontal angle signal coming from the angle sensor (not shown) built in the scanner unit 36, and supplies it to the clock generation unit 53 of the signal processing circuit 31.

In the step S4, the clock generation unit 53 performs the clock adjustment processing to adjust the fixed pixel clock. Then, the clock generation unit 53 supplies the fixed pixel clock after adjustment by the clock adjustment processing as a variable pixel clock, to the frame memory 52 and the laser control unit 54.

Incidentally, the clock adjustment processing of the step S4 is continued also after the step S5 and the subsequent steps. The detail of the clock adjustment processing will be described later, with reference to FIG. 16.

In the step S5, the laser control unit 54 controls the laser drive circuit 32 in synchronization with the variable pixel clock coming from the clock generation unit 53, thereby allowing illumination of the laser beam as a pixel on the screen 12.

That is, for example, the laser control unit 54 supplies a projection video signal it has generated for each color on the basis of a laser power monitor signal obtained from the light-receiving element 35, together with the variable pixel clock from the clock generation unit 53, and with a video current control signal, to the laser drive circuit 32, in synchronization with the variable pixel clock from the clock generation unit 53.

The laser control unit 54 controls the laser drive circuit 32 in synchronization with the vertical sync signal coming from the clock generation unit 53 so that the illumination of the laser beam is not performed during blanking intervals.

In the step S6, each of the laser drive units 71B, 71G and 71R of the laser drive circuit 32 generates a laser drive current, under the control of the laser control unit 54, and supplies it to the corresponding one of the laser light sources 91B, 91G and 91R of the light source unit 33. Specifically, in synchronization with the variable pixel clock coming from the laser control unit 54, and on the basis of the projection video signal which is also supplied from the laser control unit 54, the laser drive units 71B, 71G and 71R generate the laser drive currents of the respective colors and supply them to the laser light sources 91B, 91G and 91R, respectively. By the laser drive currents of the respective colors being supplied from the laser drive units 71B, 71G and 71R, the laser light sources 91B, 91G and 91R are driven respectively.

In the step S7, each of the laser light sources 91B, 91G and 91R emits a laser beam, based on the laser drive current coming from the corresponding one of the laser drive units 71B, 71G and 71R. These laser beams pass through the beam splitter 34, as a single laser beam, to illuminate the driving mirror 111.

In addition, a part of the laser beam each emitted from the laser light sources 91B, 91G and 91R is reflected by the beam splitter 34 toward the direction of the light-receiving element 35. Thus, the light-receiving element 35 detects the respective optical outputs (optical powers) of the laser light sources 91B, 91G and 91R of the light source unit 33, by receiving the light of the laser beam from the beam splitter 34. Then, the light-receiving element 35 supplies the detected results, as the laser power monitor signal, to the laser control unit 54 of the signal processing circuit 31.

In the step S8, the system control unit 55 determines whether or not a cancel operation which instructs to stop the projection processing is made, based on an operation signal coming from an operation unit (not shown). If determined that the cancel operation is not made, the process returns to the step S1, and the same processing thereafter is repeated.

In the step S8, if the system control unit 55 determines that the cancel operation has been made, based on the operation signal coming from the operation unit (not shown), it ends the projection processing.

[Detail of Clock Adjustment Processing]

Figure 16:
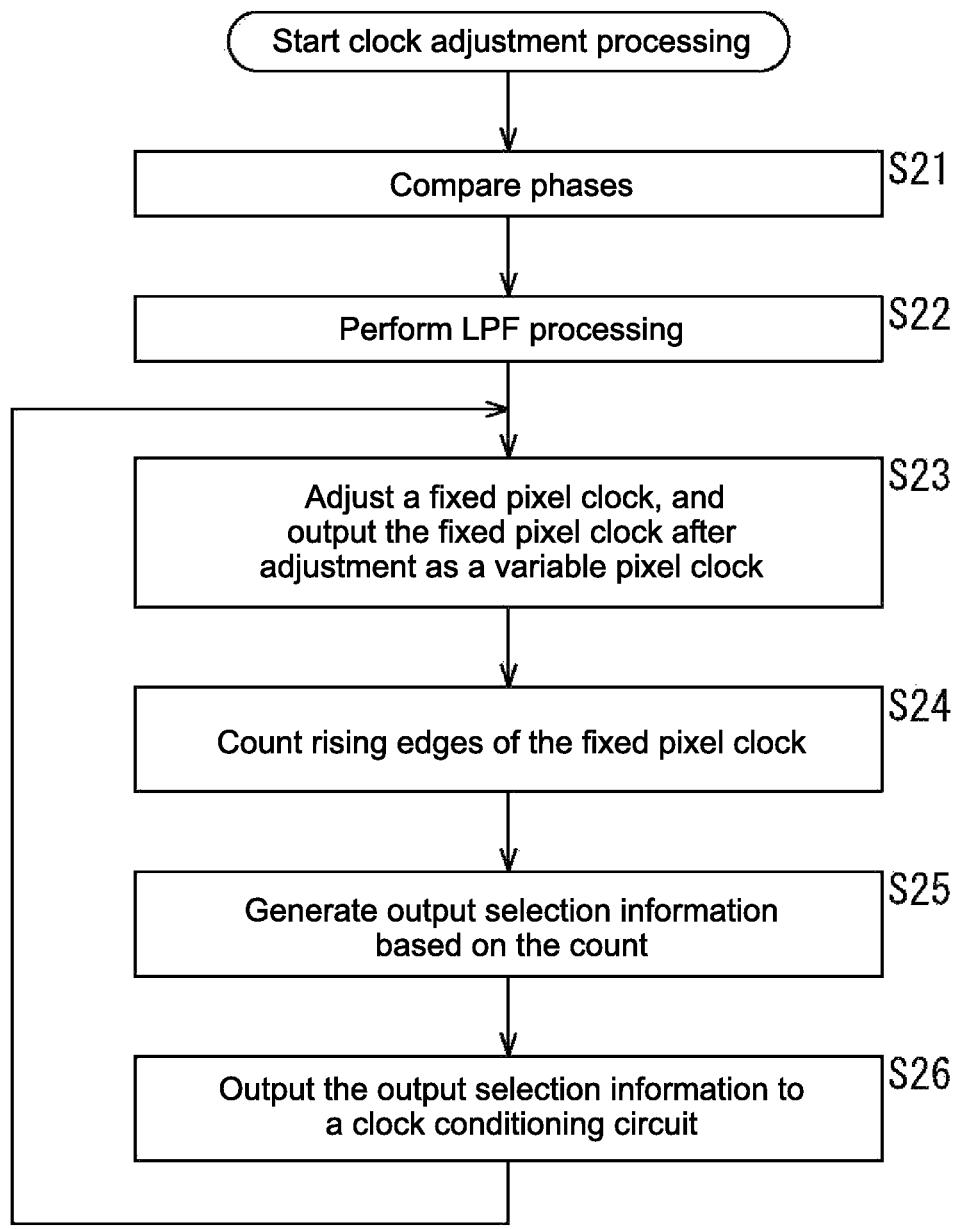
FIG. 16 is a flowchart for explaining the clock adjustment processing of the step S4 in FIG. 15.

Next, with reference to a flowchart of FIG. 16, the detail of the clock adjustment processing of the step S4 of FIG. 15 will be described.

In the step S21, the phase comparator 151 compares the fixed pixel clock coming from the control circuit 134 with an output fed back from the clock conditioning circuit 153, and supplies the result of the comparison to the loop filter 152.

In the step S22, the loop filter 152 performs LPF processing on the result of the comparison coming from the phase comparator 151, to remove the high frequency component therefrom, and outputs the result of the comparison after LPF to the clock conditioning circuit 153.

In the step S23, the clock conditioning circuit 153 adjusts the fixed pixel clock, based on output selection information coming from the output selection circuit 154, and supplies the fixed pixel clock after adjustment as the variable pixel clock, to the frame memory 52 and the laser control unit 54 of FIG. 2. Incidentally, in the step S26 which will be described later, the output selection information is to be supplied to the conditioning circuit 153 from the latch circuit 193 of the output selection circuit 154.

In the step S24, in the output selection circuit 154, the counter 191 determines whether or not the rising edge on the fixed pixel clock has occurred, based on the fixed pixel clock coming from the clock conditioning circuit 153. If determined that the rising edge has occurred, it adds 1 to (increment) its count C. Then, the counter 191 outputs the incremented count C to the delay generation circuit 192. In addition, the count C represents the scanning position on the screen 12.

Further, the counter 191 resets the count C to 0 when it has detected the rising edge of the horizontal sync signal supplied from the control circuit 134 of the scanner drive circuit 37 of FIG. 2.

In the step S25, the delay generation circuit 192 reads the output selection information that corresponds to the count C among a plurality of different pieces of output selection information, from the table held by the RAM 192*a*, based on the count C coming from the counter 191, and supplies it to the latch circuit 193.

In the step S26, the latch circuit 193 latches the output selection information coming from the delay generation circuit 192, and supplies it to the switch 180 of the clock conditioning circuit 153. Then, it allows the process to return to the step S23, and the same processing thereafter is repeated.

As described above, according to the clock adjustment processing, the clock conditioning circuit 153 is configured to generate the variable pixel clock by adjusting the fixed pixel clock on the basis of the scanning position. Further, the laser control unit 54 is configured to control the illumination of the laser beam in synchronization with the variable pixel clock coming from the clock conditioning circuit 153.

Therefore, the projection apparatus 11 is able to suppress luminance non-uniformity, while suppressing the deterioration of the image quality, power consumption, radiation noise and the like.

2. Variations

In this embodiment, the projection apparatus 11 has been configured to emit the laser beam at the same optical power for the same illumination time in an intermittent manner as shown in FIG. 13A. However, the way of illumination of the laser beam is not limited thereto.

Figure 17A:
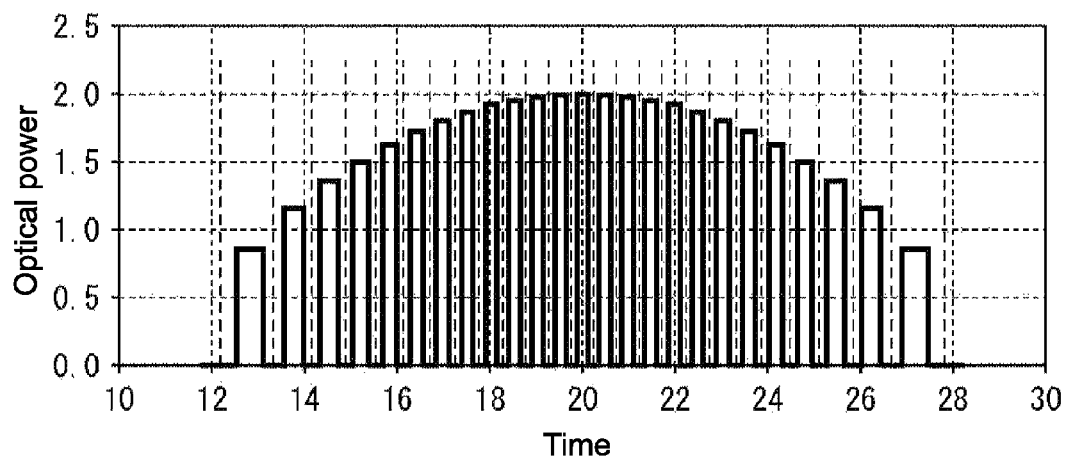
FIGS. 17A and 17B are diagrams showing an example of a case where the projection apparatus emits a laser beam intermittently, at a different optical power for each scanning position, in synchronization with a variable pixel clock.
Figure 17B:
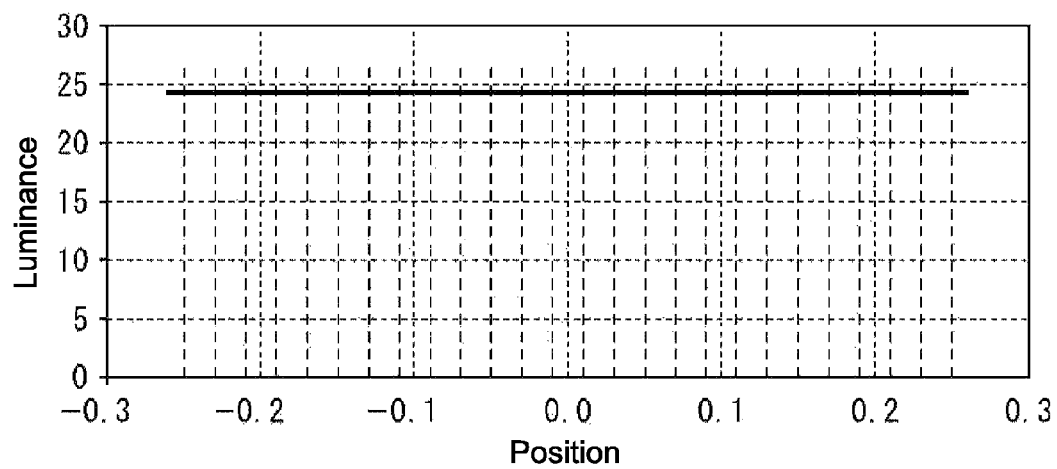

FIGS. 17A and 17B show an example of a case where the projection apparatus 11 emits a laser beam intermittently, at a different optical power and for a different illumination time for each scanning position, in synchronization with the variable pixel clock.

FIG. 17A shows an example of a case where a duty cycle of the illumination time for projecting a pixel, for each of the pixels, on the variable pixel clock, is a fixed duty ratio.

Herein, the "duty ratio" indicates a ratio of the illumination time (illumination time at the time of projecting a pixel in synchronization with the timing that the rising edge 0 occurs), to a pixel period from the time that a rising edge x occurs on the variable pixel clock until the next rising edge x+1 occurs thereon. The duty ratio is made substantially the same for each pixel projected irrespective of the scanning position of the laser beam.

In FIG. 17A, while emitting the laser beam for a different illumination time for each pixel period, the optical power is made different for each pixel period, such that a total of optical power of the laser beam as the pixel projected becomes substantially the same.

That is, for example, the laser control unit 54 controls the laser drive circuit 32 in synchronization with the variable pixel clock coming from the clock generation unit 53, in such a manner as shown in FIG. 17A, so that the laser beam is emitted at a lower optical power as it becomes nearer to the edge of the screen 12.

More specifically, the laser control unit 54 controls the laser drive circuit 32 in synchronization with the variable pixel clock coming from the clock generation unit 53 so that the laser beam is emitted at a different optical power and for a different illumination time for each scanning position. In other words, the laser drive circuit 32 allows illumination of such a laser beam by driving the light source unit 33, under the control of the laser control unit 54.

Since the total of optical power (=optical power x illumination time) of the laser beam emitted in the pixel period is made substantially the same in every pixel, the luminance becomes substantially the same in every position, as shown in FIG. 17B, and thus it is able to prevent luminance non-uniformity.

Further, in FIG. 17A, in a same manner in the case of FIG. 13A, since the laser beam is emitted with a longer time interval as it becomes nearer to the edge of the screen 12, it is able to illuminate with the laser beam as pixels at even intervals on the screen 12.

Incidentally, in the projection apparatus 11, in order to form a small spot beam corresponding to the size of the pixel on the screen 12, it is configured to illuminate with a laser beam which is the light with relatively narrow spectral width of the wavelength and with relatively uniform phase (light with high coherence).

This may lead to that the projection apparatus 11 raises a pattern of spots called "speckle noise", which is due to microscopic irregularities on the screen 12, on the retina of the viewer viewing the projection image on the screen 12.

Therefore, the projection apparatus 11 may emit from each of the laser light sources 91B, 91G and 91R a laser beam with a wider spectral width, or in other words, make the laser beams the light with low coherence so as to reduce the speckle noise.

Figure 18A:
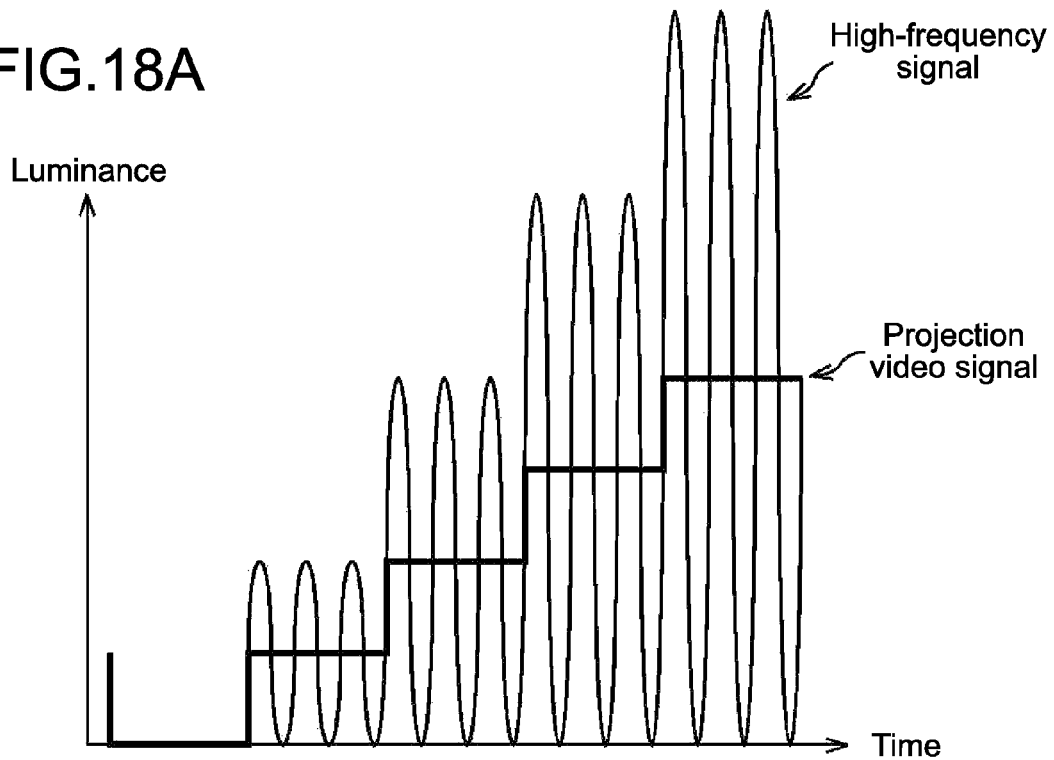
FIGS. 18A and 18B are diagrams showing an example of a high-frequency signal superimposed on a laser drive current.
Figure 18B:
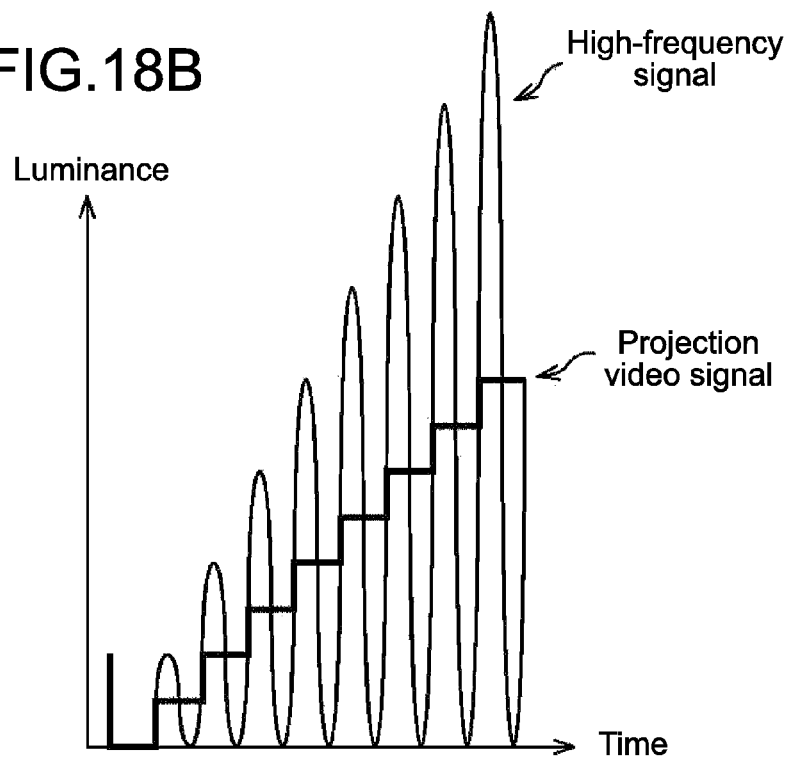

FIGS. 18A and 18B show an example of a process to make a laser beam into the light with low coherence.

FIG. 18A shows an example of a projection video signal and a high-frequency signal superimposed on the projection video signal. The projection video signal and the high-frequency signal shown in FIG. 18A are those in the case where the resolution of the projection image, the frequency of the projection video signal, and the frequency of the variable pixel clock are relatively low. In the case of FIG. 18A, the frequency of the high-frequency signal is higher than the frequencies of the projection video signal and the variable pixel clock.

FIG. 18B shows another example of a projection video signal and a high-frequency signal superimposed on the projection video signal. The projection video signal and the high-frequency signal shown in FIG. 18B are those in the case where the resolution of the projection image, the frequency of the projection video signal and the frequency of the variable pixel clock are relatively high. In the case of FIG. 18B, the frequency of the high-frequency signal is substantially the same as the frequencies of the projection video signal and the variable pixel clock.

The laser drive units 71R, 71G and 71B each superimposes a high-frequency signal to the projection image signal coming from the laser control unit 54, generates a laser drive current, and supplies the laser drive current to the corresponding one of the laser light sources 91R, 91G and 91B. The laser drive current is generated by amplification of the projection image signal after superimposition, to the current value which is necessary for driving the laser light sources 91R, 91G and 91B, for example.

The laser light sources 91R, 91G and 91B would each emit the laser beam with low coherence, based on the laser drive current obtained by superimposition of the high-frequency signal on the projection image signal.

However, in cases where the laser drive current is generated with the high-frequency signal being superimposed as shown in FIGS. 18A and 18B, a radiation noise would be more likely to occur because the amplitude of such a laser drive current becomes greater than in the case without superimposition of the high-frequency signal.

In such cases, for example, it is desirable that the projection apparatus 11 vary not only the timing of illumination of the laser beam but also the illumination time of the laser beam illuminated as a pixel, in accordance with the scanning position, as shown in FIG. 17A.

In other words, for example, it is desirable that the projection apparatus 11 reduce the peak of the radiation noise by allowing illumination of the laser beam in synchronization with a variable pixel clock whose frequency component is distributed over a broader band range. Thus, for example, it is able to make the projection apparatus 11 so that it conforms to EMI standard without using a shielding member or the like.

Incidentally, in this embodiment, the projection apparatus 11 has been configured to emit the respective laser beams of red, green, and blue. However, it may be configured to emit other laser beams (such as another red laser beam) newly, together with the red, green, and blue laser beams.

In this case, the light source unit 33 may be newly provided with a laser light source for emitting the other laser beam, with a collimating lens and a dichroic mirror. The laser drive circuit 32 may be newly provided with a laser drive unit to drive the laser light source for emitting the other laser beam.

Further, in this embodiment, it has explained the projection apparatus 11 for projecting an image on the screen 12. However, some embodiments of the present disclosure are applicable to an electronic apparatus such as smart phones and personal computers having the function of projecting an image.

That is, for example, the embodiments of the present disclosure are applicable to any electronic apparatus as long as the electronic apparatus has a built-in configuration of a laser control unit 54 and a laser drive circuit 32. The laser control unit 54 adjusts a fixed pixel clock to a variable pixel clock and controls a laser beam in synchronization with the variable pixel clock. The laser drive circuit 32 drives the light source unit 33 under the control of the laser control unit 54.

Furthermore, for example, some embodiments of the present disclosure are applicable to a control apparatus which controls a laser beam in synchronization with a variable pixel clock. This control apparatus includes a clock generation unit 53 and a laser control unit 54. The clock generation unit 53 adjusts a fixed pixel clock to the variable pixel clock. The laser control unit 54 allows illumination of the laser beam as a pixel, in synchronization with the variable pixel clock coming from the clock generation unit 53.

Still further, some embodiments of the present disclosure are applicable to a driving apparatus which drives a light source unit 33 to illuminate with a laser beam in synchronization with a variable pixel clock. This driving apparatus includes a clock generation unit 53 and a laser drive circuit 32. The clock generation unit 53 adjusts a fixed pixel clock to the variable pixel clock. The laser drive circuit 32 drives the light source unit 33 on the basis of the laser drive current it has generated in synchronization with the variable pixel clock coming from the clock generation unit 53.

In addition, the clock conditioning circuit 153 of FIG. 9 has been configured to adjust the fixed pixel clock generating rising edges at regular intervals to the variable pixel clock. However, the target of adjustment is not limited thereto.

That is, the target of adjustment may be any clock as long as the clock indicates a timing of illumination of the laser beam allowed to scan on the screen. The clock is not necessarily a fixed pixel clock which generates rising edges at regular intervals.

Further, in this embodiment, the clock generation unit 53 has been configured to generate the variable pixel clock by delaying the rising edges of the fixed pixel clock, based on the scanning position on the screen 12. However, the way of generation of the variable pixel clock is not limited thereto.

That is, for example, the clock generation unit 53 may be configured to generate the variable pixel clock by putting forward the rising edges of the fixed pixel clock.

The present disclosure may employ the following configurations.

(1) A Control Apparatus Including:

a generation unit configured to generate adjustment information to adjust a first clock indicating a timing of illumination of a laser beam to scan on a screen, based on a scanning position to be scanned by the laser beam;

an adjustment unit configured to adjust the first clock to a second clock different from the first clock, based on the adjustment information; and a laser control unit configured to allow illumination of the laser beam as a pixel, in synchronization with the second clock.

(2) The control apparatus according to (1), in which the laser control unit is configured to allow the illumination of the laser beam, in synchronization with the second clock, such that a total of optical power of the laser beam is substantially the same for each pixel projected on the screen.

(3) The control apparatus according to (2), in which the laser control unit is configured to allow the illumination of the laser beam at a fixed optical power for a fixed illumination time irrespective of the scanning position, in synchronization with the second clock, such that a total of optical power of the laser beam is substantially the same for each pixel projected on the screen.

(4) The control apparatus according to (2), in which
the laser control unit is configured to allow the illumination of the laser beam at a different optical power and for a different illumination time for each scanning position, in synchronization with the second clock, such that a total of optical power of the laser beam is substantially the same for each pixel projected on the screen.

(5) The control apparatus according to (4), in which
a ratio of the illumination time, to a pixel period from the time that a rising edge occurs until the next rising edge occurs, is made to be substantially the same irrespective of the scanning position.

(6) The control apparatus according to any one of (1) to (5), in which
the laser control unit is configured to allow illumination with the laser beam as pixels, on the screen at even intervals, in synchronization with the second clock.

(7) The control apparatus according to (1), in which
the generation unit is configured to generate the adjustment information, based on the scanning position, for delaying the first clock by a delay time that depends on the scanning position; and
the adjustment unit is configured to adjust the first clock to the second clock that is delayed from the first clock by the delay time, based on the adjustment information.

(8) The control apparatus according to (7), in which
the adjustment unit includes
a timing delay unit configured to delay the first clock by a plurality of different delay times to obtain a plurality of delayed first clocks; and
a selection unit configured to select one among the plurality of delayed first clocks delayed by the respective different delay times, as the second clock, based on the adjustment information.

(9) The control apparatus according to (7), in which
the generation unit includes
a position calculation unit configured to calculate the scanning position, based on the first clock; and
an information acquisition unit configured to retrieve, from a plurality of different pieces of adjustment information held in advance, the adjustment information for delaying by the delay time that depends on the calculated scanning position.

(10) The control apparatus according to any one of (1) to (9), in which
the laser control unit is configured to allow illumination of red, green, and blue laser beams in a form of a single laser beam, in synchronization with the second clock.

(11) A method of controlling a control apparatus to control laser illumination, the method by the control apparatus including:
generating adjustment information to adjust a first clock indicating a timing of illumination of a laser beam to scan on a screen, based on a scanning position to be scanned by the laser beam;
adjusting the first clock to a second clock different from the first clock, based on the adjustment information; and
controlling laser so as to allow illumination of the laser beam as a pixel in synchronization with the second clock.

(12) A driving apparatus comprising:
a generation unit configured to generate adjustment information to adjust a first clock indicating a timing of illumination of a laser beam to scan on a screen, based on a scanning position to be scanned by the laser beam;
an adjustment unit configured to adjust the first clock to a second clock different from the first clock, based on the adjustment information; and
a laser drive unit configured to drive a light source unit to illuminate with the laser beam, in synchronization with the second clock.

(13) The driving apparatus according to (12), in which
the laser drive unit is configured to drive the light source unit to illuminate with the laser beam, in synchronization with the second clock, such that a total of optical power of the laser beam is substantially the same for each pixel projected on the screen.

(14) The driving apparatus according to (13), in which
the laser drive unit is configured to drive the light source unit to illuminate with the laser beam at a fixed optical power for a fixed illumination time irrespective of the scanning position, in synchronization with the second clock, such that a total of optical power of the laser beam is substantially the same for each pixel projected on the screen.

(15) The driving apparatus according to (13), in which
the laser drive unit is configured to drive the light source unit to illuminate with the laser beam at a different optical power and for a different illumination time for each scanning position, in synchronization with the second clock, such that a total of optical power of the laser beam is substantially the same for each pixel projected on the screen.

(16) The driving apparatus according to (15), in which
a ratio of the illumination time, to a pixel period from the time that a rising edge occurs until the next rising edge occurs, is made to be substantially the same irrespective of the scanning position.

(17) The driving apparatus according to any one of (12) to (16), in which
the laser drive unit is configured to drive the light source unit to illuminate with the laser beam as pixels, on the screen at even intervals, in synchronization with the second clock.

(18) The driving apparatus according to any one of (12) to (17), in which
the light source unit includes at least
a first laser light source configured to illuminate with a red laser beam,
a second laser light source configured to illuminate with a green laser beam and
a third laser light source configured to illuminate with a blue laser beam; and
the laser drive unit includes at least
a first generating-and-driving unit configured to generate a first laser drive current for allowing the illumination of the red laser beam, in synchronization with the second clock, and to drive the first laser light source on the basis of the generated first laser drive current,
a second generating-and-driving unit configured to generate a second laser drive current for allowing the illumination of the green laser beam, in synchronization with the second clock, and to drive the second laser light source on the basis of the generated second laser drive current, and
a third generating-and-driving unit configured to generate a third laser drive current for allowing the illumination of the blue laser beam, in synchronization with the second clock, and to drive the third laser light source on the basis of the generated third laser drive current.

(19) An electronic apparatus including:
a light source unit configured to illuminate with a laser beam;
a laser drive unit configured to drive the light source unit;
a generation unit configured to generate adjustment information to adjust a first clock indicating a timing of illumination of a laser beam to scan on a screen, based on a scanning position to be scanned by the laser beam;

an adjustment unit configured to adjust the first clock to a second clock different from the first clock, based on the adjustment information; and a laser control unit configured to control the laser drive unit to drive the light source unit in synchronization with the second clock.

The series of processes described above may either be executed by hardware or by software, for example. In cases where the series of processes is executed by software, programs configuring that software would be installed from some program recording media to a computer that is built in dedicated hardware; or to a general-purpose computer or other devices which are capable of performing various functions by installation of various programs.

[Configuration Example of Computer]

Figure 19:
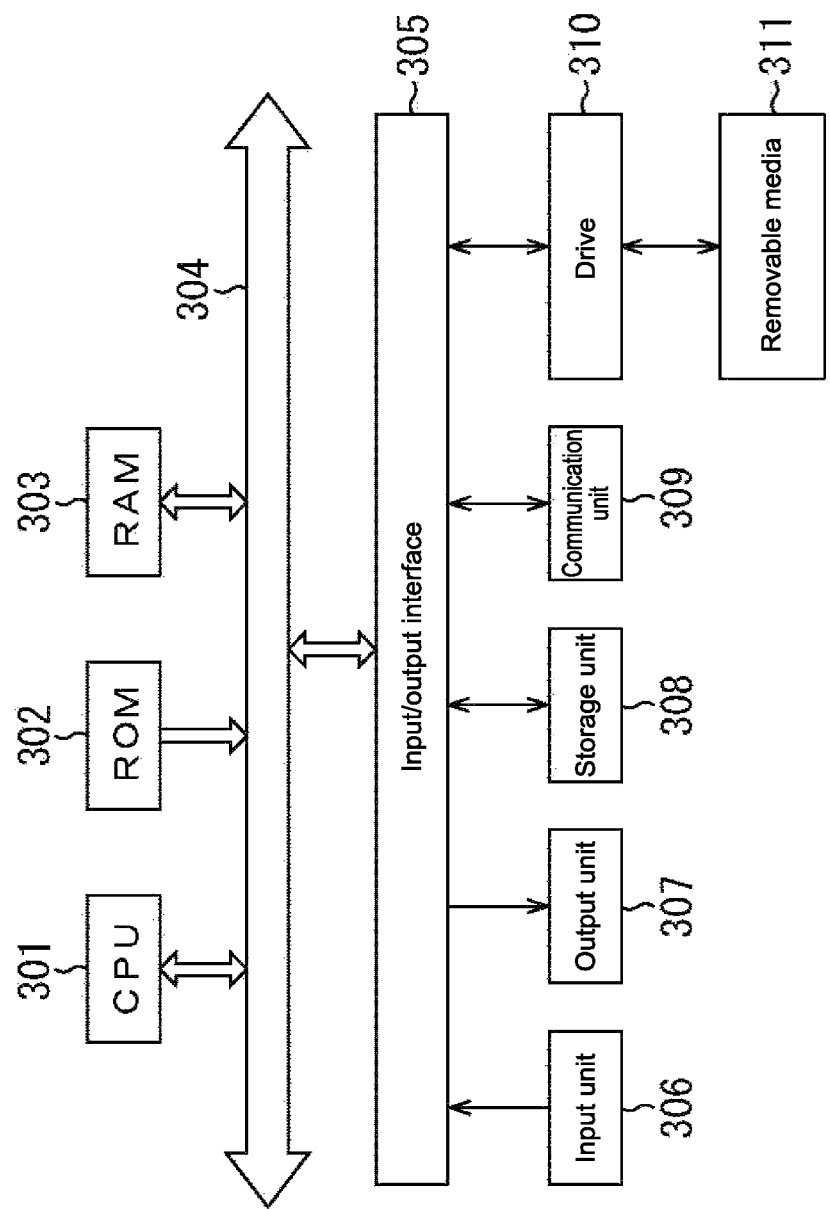
FIG. 19 is a block diagram showing a configuration example of a computer.

FIG. 19 shows a configuration example of a computer which executes the series of processes described above by a program.

A CPU 301 executes various processes in accordance with the program stored in a ROM (Read Only Memory) 302 or in a storage unit 308. A RAM 303 stores the program executed by the CPU 301, and data or the like, as appropriate. These CPU 301, ROM 303 and RAM 303 are mutually connected to each other via a bus 304.

To the CPU 301, via the bus 304, an input/output interface 305 is also connected. To the input/output interface 305, an input unit 306 which includes a component such as a keyboard, a mouse, and a microphone; and an output unit 307 which includes a component such as a display and a speaker are connected. The CPU 301 executes various processes in response to commands input from the input unit 306. Then, the CPU 301 outputs the results of the processes.

The storage unit 308 connected to the input/output interface 305 includes a hard disk, for example, and stores the program executed by the CPU 301 and various data. The communication unit 309 communicates with external devices via a network such as the Internet and a local area network.

In addition, it may retrieve the program via the communication unit 309 and store it in the storage unit 308.

To the input/output interface 305, a drive 310 is connected. The drive 310 drives some removable media 311 such as a magnetic disk, an optical disc, a magneto-optical disk and a semiconductor memory when they are loaded thereto so as to obtain the program, data or the like recorded on the removable media 311. The obtained program and data would be transferred as necessary to the storage unit 308 and then be stored.

As shown in FIG. 19, the recording media to record (store) the program to be installed to the computer and enabled by the computer include the removable media 311 which are package media including a magnetic disk (including a flexible disk), an optical disc (including CD-ROM (Compact Disc-Read Only Memory) or DVD (Digital Versatile Disc)), a magneto-optical disc (including MD (Mini-Disc)), a semiconductor memory or the like; the ROM 302 in which programs are stored temporarily or permanently; and hard disk making up the storage unit 308 and the like. Recording of the program to the recording media is made by utilizing a local area network, the Internet, digital satellite broadcasting, or other wired or wireless transmission medium, via the communication unit which is an interface such as a router and a modem, as necessary.

Herein, the steps which have described the series of processes above include not only the processes performed chronologically in the described order but also the processes performed in parallel or individually which are not necessarily chronologically.

Further, the present disclosure is not limited to the aforementioned embodiments, and various modifications are available within the scope without departing from the gist of the present disclosure.

It should be understood by those skilled in the art that various modifications, combinations, sub-combinations and alterations may occur depending on design requirements and other factors insofar as they are within the scope of the appended claims or the equivalents thereof.

What is claimed is:

1. A control apparatus comprising:
   a generation unit configured to generate adjustment information to adjust a first clock indicating a timing of illumination of a laser beam to scan on a screen, based on a scanning position to be scanned by the laser beam;
   an adjustment unit configured to adjust the first clock to a second clock different from the first clock, based on the adjustment information; and
   a laser control unit configured to allow illumination of the laser beam as a pixel, in synchronization with the second clock.

2. The control apparatus according to claim 1, wherein the laser control unit is configured to allow the illumination of the laser beam, in synchronization with the second clock, such that a total of optical power of the laser beam is substantially the same for each pixel projected on the screen.

3. The control apparatus according to claim 2, wherein the laser control unit is configured to allow the illumination of the laser beam at a fixed optical power for a fixed illumination time irrespective of the scanning position, in synchronization with the second clock, such that a total of optical power of the laser beam is substantially the same for each pixel projected on the screen.

4. The control apparatus according to claim 2, wherein the laser control unit is configured to allow the illumination of the laser beam at a different optical power and for a different illumination time for each scanning position, in synchronization with the second clock, such that a total of optical power of the laser beam is substantially the same for each pixel projected on the screen.

5. The control apparatus according to claim 4, wherein a ratio of the illumination time, to a pixel period from the time that a rising edge occurs until the next rising edge occurs, is made to be substantially the same irrespective of the scanning position.

6. The control apparatus according to claim 1, wherein the laser control unit is configured to allow illumination with the laser beam as pixels, on the screen at even intervals, in synchronization with the second clock.

7. The control apparatus according to claim 1, wherein the generation unit is configured to generate the adjustment information, based on the scanning position, for delaying the first clock by a delay time that depends on the scanning position; and
   the adjustment unit is configured to adjust the first clock to the second clock that is delayed from the first clock by the delay time, based on the adjustment information.

8. The control apparatus according to claim 7, wherein the adjustment unit includes
   a timing delay unit configured to delay the first clock by a plurality of different delay times to obtain a plurality of delayed first clocks; and
   a selection unit configured to select one among the plurality of delayed first clocks delayed by the respective different delay times, as the second clock, based on the adjustment information.

9. The control apparatus according to claim 7, wherein the generation unit includes
- a position calculation unit configured to calculate the scanning position, based on the first clock; and
- an information acquisition unit configured to retrieve, from a plurality of different pieces of adjustment information held in advance, the adjustment information for delaying by the delay time that depends on the calculated scanning position.

10. The control apparatus according to claim 1, wherein the laser control unit is configured to allow illumination of red, green, and blue laser beams in a form of a single laser beam, in synchronization with the second clock.

11. A method of controlling a control apparatus to control laser illumination, the method by the control apparatus comprising:
- generating adjustment information to adjust a first clock indicating a timing of illumination of a laser beam to scan on a screen, based on a scanning position to be scanned by the laser beam;
- adjusting the first clock to a second clock different from the first clock, based on the adjustment information; and
- controlling laser so as to allow illumination of the laser beam as a pixel in synchronization with the second clock.

12. A driving apparatus comprising:
- a generation unit configured to generate adjustment information to adjust a first clock indicating a timing of illumination of a laser beam to scan on a screen, based on a scanning position to be scanned by the laser beam;
- an adjustment unit configured to adjust the first clock to a second clock different from the first clock, based on the adjustment information; and
- a laser drive unit configured to drive a light source unit to illuminate with the laser beam, in synchronization with the second clock.

13. The driving apparatus according to claim 12, wherein the laser drive unit is configured to drive the light source unit to illuminate with the laser beam, in synchronization with the second clock, such that a total of optical power of the laser beam is substantially the same for each pixel projected on the screen.

14. The driving apparatus according to claim 13, wherein the laser drive unit is configured to drive the light source unit to illuminate with the laser beam at a fixed optical power for a fixed illumination time irrespective of the scanning position, in synchronization with the second clock, such that a total of optical power of the laser beam is substantially the same for each pixel projected on the screen.

15. The driving apparatus according to claim 13, wherein the laser drive unit is configured to drive the light source unit to illuminate with the laser beam at a different optical power and for a different illumination time for each scanning position, in synchronization with the second clock, such that a total of optical power of the laser beam is substantially the same for each pixel projected on the screen.

16. The driving apparatus according to claim 15, wherein a ratio of the illumination time, to a pixel period from the time that a rising edge occurs until the next rising edge occurs, is made to be substantially the same irrespective of the scanning position.

17. The driving apparatus according to claim 12, wherein the laser drive unit is configured to drive the light source unit to illuminate with the laser beam as pixels, on the screen at even intervals, in synchronization with the second clock.

18. The driving apparatus according to claim 12, wherein the light source unit includes at least
- a first laser light source configured to illuminate with a red laser beam,
- a second laser light source configured to illuminate with a green laser beam and
- a third laser light source configured to illuminate with a blue laser beam; and the laser drive unit includes at least
- a first generating-and-driving unit configured to generate a first laser drive current for allowing the illumination of the red laser beam, in synchronization with the second clock, and to drive the first laser light source on the basis of the generated first laser drive current,
- a second generating-and-driving unit configured to generate a second laser drive current for allowing the illumination of the green laser beam, in synchronization with the second clock, and to drive the second laser light source on the basis of the generated second laser drive current, and
- a third generating-and-driving unit configured to generate a third laser drive current for allowing the illumination of the blue laser beam, in synchronization with the second clock, and to drive the third laser light source on the basis of the generated third laser drive current.

19. An electronic apparatus comprising:
a light source unit configured to illuminate with a laser beam;
a laser drive unit configured to drive the light source unit;
a generation unit configured to generate adjustment information to adjust a first clock indicating a timing of illumination of a laser beam to scan on a screen, based on a scanning position to be scanned by the laser beam;
an adjustment unit configured to adjust the first clock to a second clock different from the first clock, based on the adjustment information; and
a laser control unit configured to control the laser drive unit to drive the light source unit in synchronization with the second clock.

* * * * *